United States Patent [19]
Ishii

[11] Patent Number: 5,250,831
[45] Date of Patent: Oct. 5, 1993

[54] DRAM DEVICE HAVING A MEMORY CELL ARRAY OF A DIVIDED BIT LINE TYPE

[75] Inventor: Tatsuya Ishii, Hyogo, Japan

[73] Assignee: Mitsubishi Denki Kabushiki Kaisha, Tokyo, Japan

[21] Appl. No.: 673,823

[22] Filed: Mar. 22, 1991

[30] Foreign Application Priority Data

Mar. 28, 1990 [JP] Japan ................ 2-79603

[51] Int. Cl.⁵ .............. H01L 29/68; H01L 29/78; H01L 29/92
[52] U.S. Cl. ...................... 257/354; 257/305; 257/908; 257/910; 257/911
[58] Field of Search .......... 257/301, 304, 305, 908, 257/910, 911

[56] References Cited

U.S. PATENT DOCUMENTS

| | | | |
|---|---|---|---|
| 4,651,183 | 3/1987 | Lange et al. | 257/908 |
| 4,763,178 | 8/1988 | Sakni et al. | 257/908 |
| 4,794,563 | 12/1988 | Maeda | 365/182 |
| 4,929,990 | 5/1990 | Yoneda | 357/23.6 |
| 4,979,013 | 12/1990 | Furutani et al. | 257/305 |
| 4,990,980 | 2/1991 | Wada | 257/304 |
| 5,010,379 | 4/1991 | Ishii | 257/305 |

FOREIGN PATENT DOCUMENTS

| | | |
|---|---|---|
| 0102178-B1 | 7/1983 | European Pat. Off. . |
| 0169332-A1 | 5/1985 | European Pat. Off. . |
| 61-23361 | 1/1986 | Japan . |
| 63-183691(A) | 1/1987 | Japan . |

OTHER PUBLICATIONS

"Technology, The Wild Card", Electronics, Sep. 1989, pp. 61-63, Cole.
"A 1Mb DRAM with a Folded Capacitor Cell Structure", 1985 IEEE ISSCC Digest of Technical Papers, Feb. 1985, pp. 244-245, Horiguchi et al.

Primary Examiner—Andrew J. James
Assistant Examiner—Ngan Van Ngo
Attorney, Agent, or Firm—Lowe, Price, LeBlanc & Becker

[57] ABSTRACT

A memory cell array (50) of a DRAM has a so-called divided bit line structure including two regions (50a and 50) divided from each other. One bit line (24) of a bit line pair is connected to a predetermined memory cell in a first memory cell array block (50a) and is kept in unloaded state in a second memory cell array block (50b). The other bit line (25) of a bit line pair is kept in unloaded state in the first memory cell array block (50a) and is connected to a predetermined memory cell in a first memory cell array block (50b). In these structures, the load state is kept same in both bit lines of the bit line pair. In the memory cell array, four memory cells are disposed in a cross-relationship, and are connected to the bit line (24) through a contact portion (17) used in common by the four memory cells. The word lines (20a and 20b) are formed to obliquely cross the bit lines and to extend perpendicularly to each other. Capacitors (3) in the memory cells have portions extended over the word lines. Transfer gate transistors (4) in the memory cells have source/drain regions (11 and 13) formed by means of self-alignment with respect to the word lines. Thus, controllability of channel lengths of the transfer gate transistors in the memory cells is improved.

7 Claims, 23 Drawing Sheets

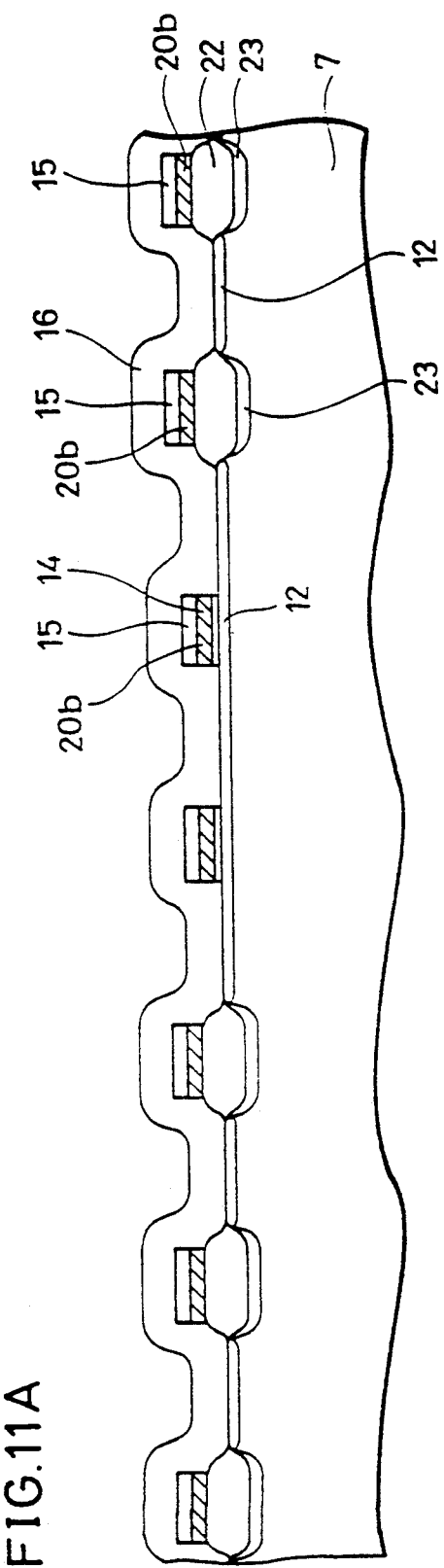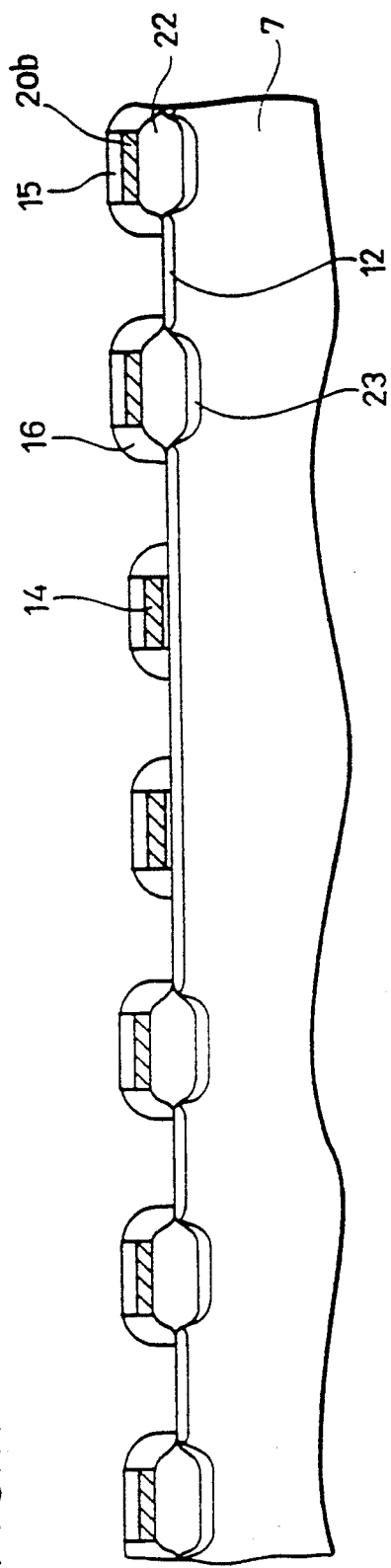

DRAM DEVICE HAVING A MEMORY CELL ARRAY OF A DIVIDED BIT LINE TYPE

BACKGROUND OF THE INVENTION

Field of the Invention

The present invention relates to a semiconductor memory device, and particularly to highly integrated structures of a semiconductor memory device including memory cells of a one-transistor and one-capacitor type.

Description of the Background Art

FIG. 17 is a block diagram illustrating a memory cell array and others in a conventional dynamic random access memory (DRAM). In the figure, the memory cell array 101 is provided with a plurality of parallel word lines 102 and a plurality of parallel bit lines 103 extending perpendicularly to the word lines 102. The memory cells (not shown) are formed at intersections of the word lines 102 and the bit lines 103. Each memory cell consists of one MOS transistor and one capacitor. One end of each word line 102 is connected to a row decoder 111. One end of each bit line is connected to a sense amplifier 113 and is further connected to a column decoder 112.

In operations, a particular memory cell is selected in such a manner that the row decoder 111 selects one of the word lines 102 based an external address signal, and the column decoder 112 selects one of the bit lines 103 based on an external address signal, whereby the above particular memory cell connected to the intersection of the selected lines is selected. Owing to this selecting operation of the memory cell, a charge accumulated in the capacitor in the memory cell is read or a data is written in the capacitor. In the reading operation of the data from the memory cell, the charge accumulated in the capacitor in the selected memory cell is sensed by the sense amplifier 113 and is amplified before reading.

FIG. 18 is an equivalent circuit diagram illustrating an example of circuit structures of the memory cell array which has been disclosed by, e.g., Japanese Laid-Open Publication No. 61-23361. Each memory cell 106 consists of one transfer gate transistor 104 and one capacitor 105. Gate electrodes of the transfer gate transistors 104 are connected to the word lines 102, respectively. Further, the four transfer gate transistors 104 is connected to one common bit line 103.

In a writing operation of the data, when a predetermined voltage is applied to the particular word line 102, the transfer gate transistors 104 connected to this word line 102 become conductive, and thus the charge applied to the bit line 103 is accumulated in the selected capacitor 105.

In the reading operation of the data, a predetermined voltage is applied to the selected word line 102 to make the transfer gate transistors 104 conductive so that the charge accumulated in the selected capacitor 105 is taken out to the bit line 103.

FIG. 19 is a plan illustrating structures of the memory cell array shown in FIG. 18. In this memory cell array, the four memory cells are disposed in a cross-relationship around a contact portion 107 of each bit line 103. Each contact portion 107 is commonly used by first source/drain regions of the transfer gate transistors 104 in each memory cell 106. Gate electrodes 108 of the transfer gate transistors 104 are extended to the above of the capacitors 105, and are connected at predetermined positions to the word lines 102 through the contact portions 109, respectively.

Essential manufacturing processes of the memory cells shown in FIG. 19 will be disclosed below with reference to FIGS. 20A-20D and 21. The FIGS. 20A-20D are cross sections of the memory cells in various manufacturing steps, and FIG. 21 is a structural plan view illustrating a step shown in FIG. 20D. With reference to FIG. 20A, n-type impurity is introduced, e.g., by an ion injection method into regions for forming capacitors on a main surface of a p-type silicon substrate 131 to form $n^-$ regions. Then, a thermal oxidation film 137, polycrystal silicon layer 135 and silicon oxide film 138 are formed successively on the surface of the p-type silicon substrate 131, and then are patterned into predetermined configurations. In this process, the capacitors 105 consisting of the $n^-$ regions 134, thermal oxidation films 137 and polycrystal silicon layers 135 are formed. The capacitors 105 are arranged in a subsequent process in such a manner that four capacitors 105 are located in a cross-relationship around each region 136 for contacting with the bit line (see FIG. 19).

Referring to FIG. 20B, n-type impurity is introduced by, e.g., the ion injection method, into predetermined regions on the surface of the p-type silicon substrate 131. Thereby, $n^-$ regions 139 are formed at locations which are adjacent to n. regions 134 of the capacitors 105 and are symmetrical around the regions 136 with angular spaces of 90 degrees between each other. These n regions 139 will form source or drain regions in the transfer gate transistors.

Referring to FIG. 20C, thermal oxidation films 140 are formed on the regions 136. Further, a polycrystal layer 141 is deposited on the surfaces of the thermal oxidation films 140 and the silicon oxide films 138. Resist 150 is further applied on the surface, and a resist pattern 150 having a predetermined configuration is formed by means of photolithography, using a mask 151 having a predetermined configuration.

Then, referring to FIG. 20D, the polycrystal silicon layer 141 is etched and selectively removed by means of the resist pattern 150. In this etching process, an opening 152 is formed on each region 136. Impurity of n-type is ion-injected into the surface of the p-type silicon substrate 131, using the patterned polycrystal layer 141 as a mask. Thereby, n regions 142 are formed. FIG. 21 is a plan illustrating structures of the memory cell array in the step shown in FIG. 20D. The four transfer gate transistors 104a-104d commonly use first source/drain regions ($n^+$ regions 142), and second source/drain region (n regions 139a-139d) are located in a cross-relationship. The $n^+$ regions 139a-139d are connected to the $n^-$ regions 134a-134d, which will form electrode layers of the capacitors 105a-105d, respectively.

After the process described above, the word lines 102 of aluminum are formed, and gate electrode wirings 141 are connected through the contact portions 109 to the word lines 102. Further, a thick insulator layer is deposited on the whole surface, and then the bit lines 103 of the aluminum are formed and connected to the $n^+$ regions 142 through the contact portions 107. Thereby, the memory cells are completed.

The DRAM described above is aimed to provide a highly integrated structures of the memory cells. The memory cells disclosed above have the capacitors of a so-call planar type. The capacitor of the planar type has a capacity which is proportional to facing area between the n⁻region 134 formed on the p-type silicon substrate and a capacitor plate (polycrystal silicon layer 135) faced to the n⁻region 134 with the thermal oxidation film 137 therebetween. Therefore, if the cells are miniaturized, and thus the facing area between the electrode layers is reduced, the capacity of the capacitor is unavoidably reduced. Accordingly, a planar occupied area of the capacitor forms a factor which restricts the high integration due to the restriction of the capacity required for a storing operation by the memory.

Further, as shown in FIGS. 20C and 20D, although first the source/drain region 142 of the transfer gate transistor 104 is formed by means of self-alignment to the gate electrodes 141, the second the source/drain region 139 is formed by using the different mask. Accordingly, there has been a disadvantageous deviation in spaces between the paired source/drain regions 139 and 142, i.e., so-call channel lengths in the respective transfer gate transistor 104. That is; a positioning error is caused in a mask alignment process for the resist patterning, using the mask 151 shown in FIG. 20C. The error in this mask alignment causes the deviation in the channel lengths in the channel regions. The deviation in the channel lengths causes different operation characteristics in the respective transfer gate transistors, resulting in low reliability of the memories.

SUMMARY OF THE INVENTION

Accordingly, it is an object of the invention to achieve high integration of a memory cell array in a DRAM.

Another object of the invention is to improve controllability of channel lengths of transfer gate transistors in memory cells in a DRAM.

Still another object of the invention is to ensure capacities of capacitors in the memory cells in the DRAM.

The invention provides a DRAM device comprising a memory cell array which includes a plurality of memory cells for storing memory information in a minimum unit on a main surface of a semiconductor substrate of a first conductive type. Each memory cell includes one transfer gate transistor and one capacitor. Each transfer gate transistor includes a gate electrode which consists of a part of a word line extending on a main surface of the semiconductor substrate with an insulator layer therebetween, and first and second impurity regions of a second conductive type which are formed in the semiconductor substrate with a predetermined space between each other and are self-aligned to the gate electrode. Each capacitor is connected to the second impurity region in the transfer gate transistor, and has a portion extending over the gate electrode. Each first impurity region is commonly used by the four transfer gate transistors, of which second impurity regions are symmetrically and uniformly disposed around the first impurity region. The word lines are arranged perpendicularly to the adjacent word lines and are continuous to the transfer gate transistors, respectively. The DRAM device further comprises bit lines which are connected to the first impurity regions, each of which is commonly used by the four transfer gate transistors, and extend in an oblique direction with respect to the word lines.

The DRAM device according to the invention, some word lines are located in parallel to extend perpendicularly to the other word lines extending in parallel to each other, and the four transfer gate transistors associated to and designated by the word line are located in a cross-relationship. The impurity regions of the respective transfer gate transistors are formed by means of self-alignment to the gate electrodes formed by portions of the word lines, respectively. Therefore, controllability of channel lengths in the transfer gate transistors can be improved. Further, capacitors of a so-called stacked type are used as the capacitors connected to the transfer gate transistors, and the capacitors may be partially extended to the above of the gate electrodes, so that sufficient capacities of the capacitors can be ensured even in reduced memory cell regions.

The foregoing and other objects, features, aspects and advantages of the present invention will become more apparent from the following detailed description of the present invention when taken in conjunction accompanying drawings.

BRIEF DESCRIPTION OF THE DRAWINGS

FIG. 5 illustrates a layout of word lines, FIG. 6 illustrates a layout of capacitor, and FIGS. 7 and 8 illustrate a layout of bit lines;

Figs. 11A, 11B, 11C, 11D, 11E, 11F, 11G, 11H, 11I and 11J are sections illustrating manufacturing processes of memory cells shown in FIG. 4;

DETAILED DESCRIPTION OF THE PREFERRED EMBODIMENTS

Figure 1:
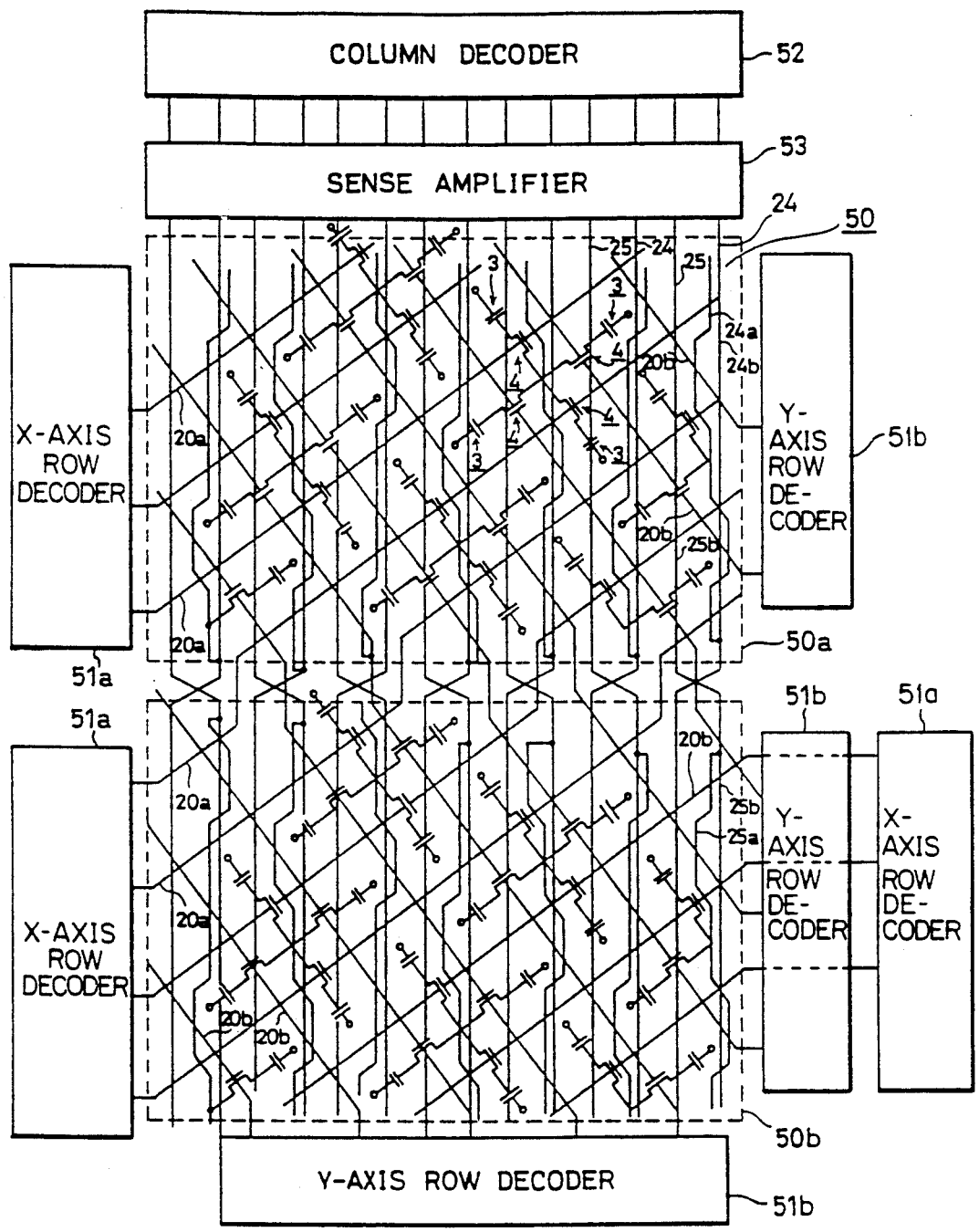
FIG. 1 is a block diagram of a memory cell array and others in a DRAM according to a first embodiment of the invention.

Referring to FIG. 1, a DRAM includes a memory cell array 50, in which a plurality of memory cells for accumulating unit memory information are disposed, X-axis and Y-axis row decoders 51a and 51b as well as a column decoder 52 for designating a particular memory cell by decoding an address signal applied from the exterior, and a sense amplifier 53 for amplifying and reading a signal accumulated in the designated memory cell.

The memory cell array 50 includes a first and second memory cell array blocks 50a and 50b divided from each other. The memory cell array 50 is provided with a plurality of bit line pairs 24 and 25 which extend in parallel to each other and are connected to the sense amplifier 53. More specifically, the bit line 24 in each bit line pair has a two-layer structure, which includes a first bit line 24b and a second bit line 24a parallel thereto, in the first memory cell array block 50a, and also has a single layer structure, which includes only the first bit line 24b, in the second memory cell array block 50b. Contrarily, the other bit line 25 in each bit line pair has a single layer structure, which includes only the first bit line 25b, in the first memory cell array block 50b, and also has a two-layer structure, which includes a first bit line 25b and a second bit line 25a parallel thereto, in the second memory cell array block 50b. The first and second bit lines 24 and 25 in each bit line pair are crossed at a boundary position between the first and second memory cell array blocks 50a and 50b. Further, in the first memory cell array block 50a, the second bit line 24a in each bit line 24 is connected at one contact portion to four memory cells. In the second memory cell array block 50b, the second bit line 25a in each bit line 25 is connected at one contact portion to four memory cells. The memory cells connected to the bit lines 24 or 25 (i.e., second bit lines 24a or 25a) are disposed in a cross-relationship angled by about 45 degrees with respect to the direction of the bit lines around the contact portions to the bit lines, respectively.

The X-axis row decoder 51a and Y-axis row decoder 51b are disposed at the vicinity of the memory cell array 50. From the X-axis row decoder 51 are extended a plurality of word lines 20a which extend in a first direction inclined about 45 degrees with respect to the bit lines 24 and 25, and from the Y-axis row decoder 51b are extended a plurality of word lines 20b which extend in a second direction perpendicular to these word lines 20a. The word lines 20a and 20b are connected to gate electrodes in the transfer gate transistors 4 in the memory cells, respectively.

Figure 2:
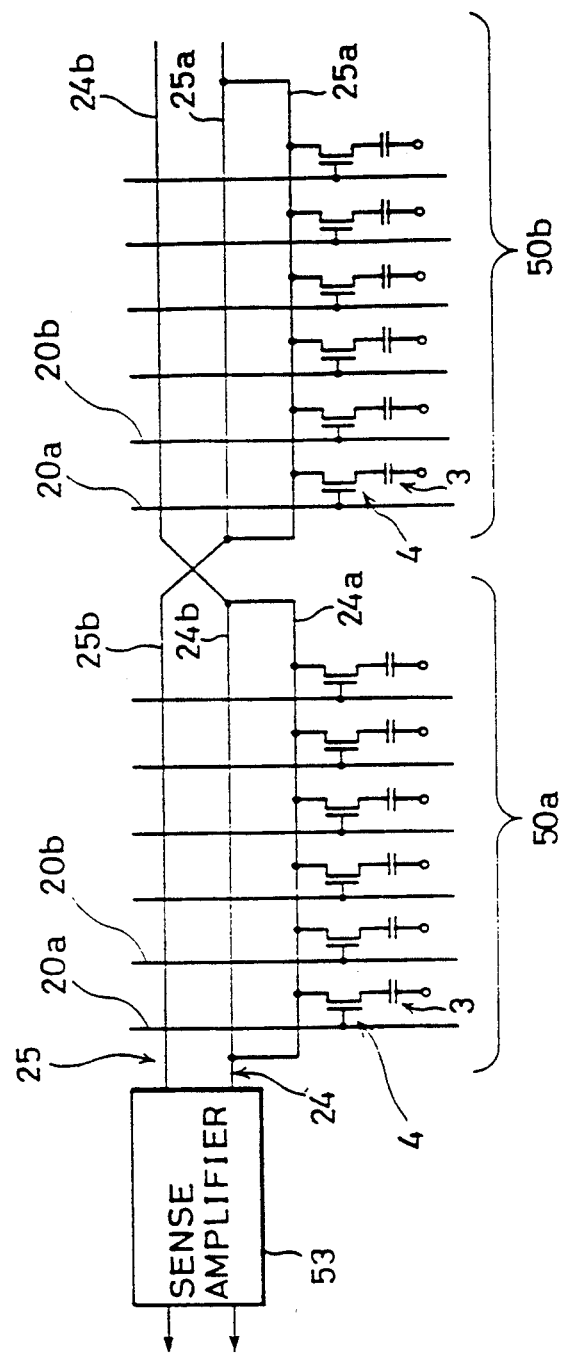
FIG. 2 is a equivalent circuit diagram of a bit line pair shown in FIG. 1.

FIG. 2 illustrates so-called divided bit line structures. In a basic data reading operation, a pair of bit lines 24 and 25 are pre-charged to a predetermined potential. Then, if the word line 20b in the first memory cell array block 50a is selected, a predetermined potential is applied to this word line 20b. Thereby, the gate of the transfer gate transistor 4 connected to the bit line 24 is opened, and the potential accumulated in the capacitor 3 is read to the bit line 24. Thus, the potential in the bit line 24 slightly fluctuates. On the other hand, the other bit line 25 is not selected by this word line 20b, so that predetermined pre-charged potential is maintained. The sense amplifier 53 senses and amplifies this potential fluctuation between a pair of these bit lines 24 and 25 to determine the existence of the stored data. In this operation, a state of an electrical load in the bit line 24 from which the potential is read from the capacitor should be same as that in the other bit line 25. In the example, the load on the bit line 24 to which the data is read is equal to a sum of the loads on the first bit line 24b and the second bit line 24a in the first memory cell array block 50a and the load on the first bit line 24b in the second memory cell array block 50b. Further, the load on the other bit line 25 is a sum of the load on the first bit line 25b in the first memory cell array block 50a and the loads on the first and second bit lines 25b and 25a in the second memory cell array block 50b. Thus, the load states in both bit lines are same. This electric load state may also be same when the word lines 20a and 20b in the second memory cell array block 50b are selected.

In this embodiment, the memory cell array has structures in which the memory cells for the four bits have one bit line contact. Further, each memory cell consists of one transfer gate transistor 4 and one capacitor 3.

Figure 3:
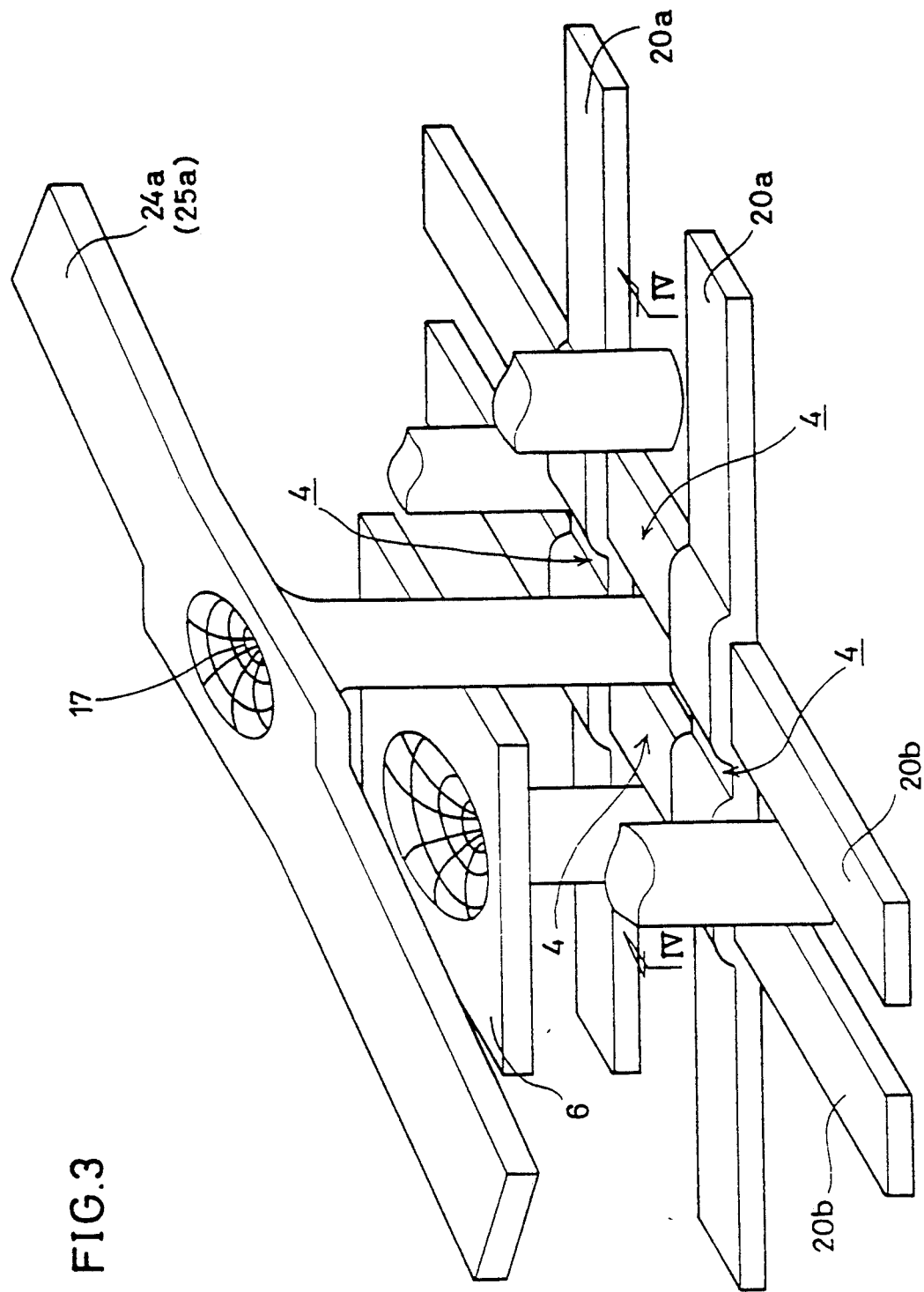
FIG. 3 is a perspective view of an essential part of a memory cell array according of a first embodiment.
Figure 5:
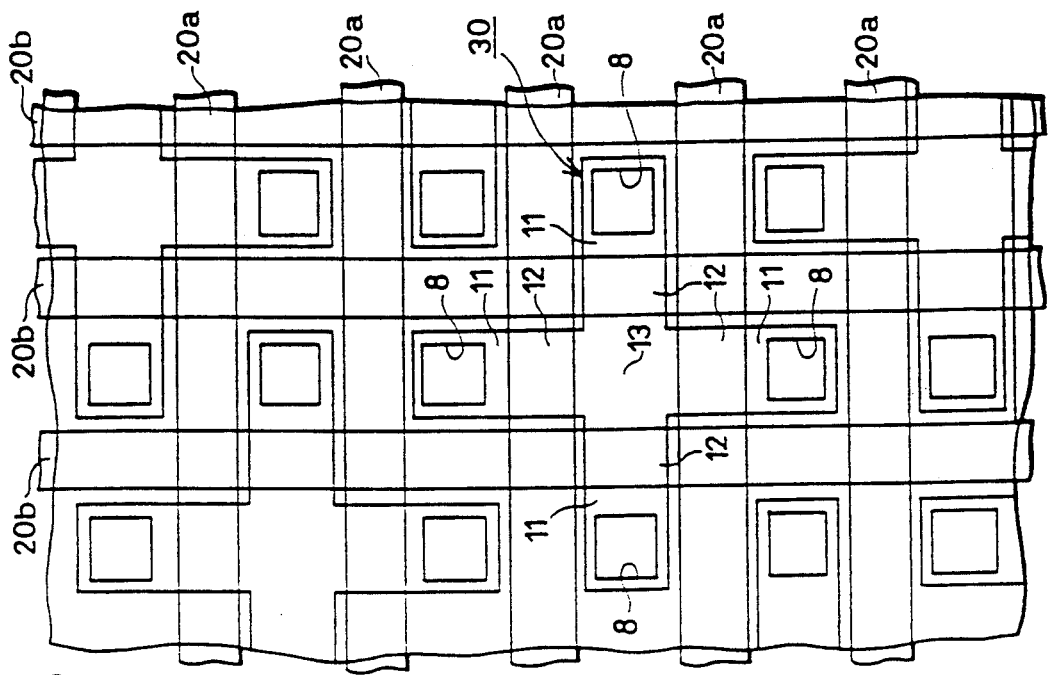
FIGS. 5, 6, 7 and 8 are schematic plan views illustrating a layout of memory cells according to a first embodiment.

Referring to FIGS. 3, 5 and others, cross-shaped active regions 30 are formed in staggered positions on the main surface of the p-type silicon substrate 7. Each active region 30 forms source/drain regions for the four transfer gate transistors, and is provided at its center with a n+impurity region 13 commonly used in the four transfer gate transistors. Four extensions of each cross around the n+impurity region 13 form n+impurity regions 11 for the other source/drain regions. A region between two n+impurity regions 11 and 13 form a channel region 12 of the transfer gate transistor. The word lines 20a and 20b are disposed to form a grid surrounding the n+impurity regions 13. These word lines 20a and 20b form gate electrodes of the transfer gate transistors. The gate electrodes (20a and 20b) are formed on surfaces of the channel regions 12, which are formed on the p-type silicon substrate 7, with gate insulator layers 14 therebetween.

Figure 4:
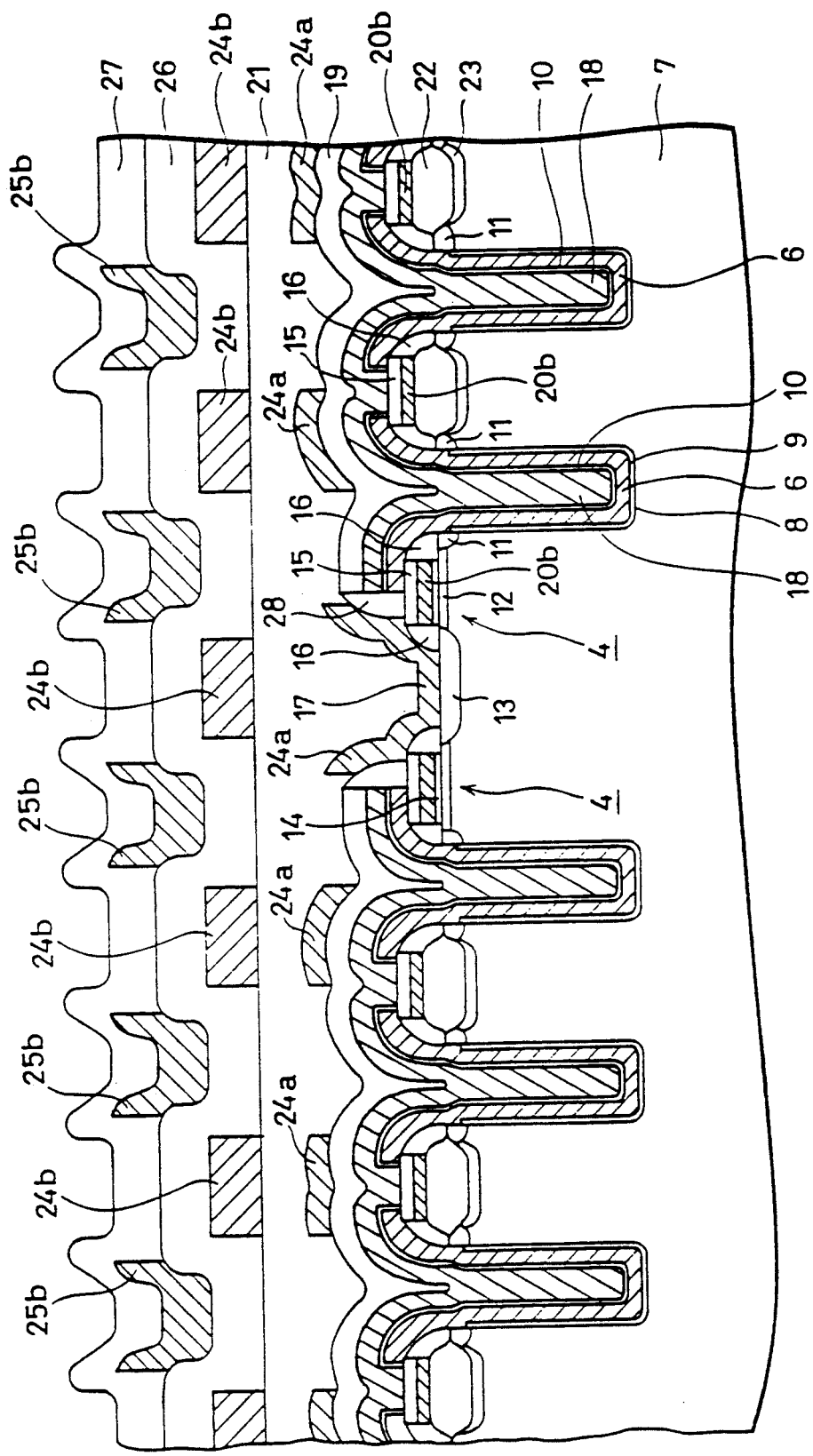
FIG. 4 is a section of structures of memory cells according to a first embodiment.
Figure 6:
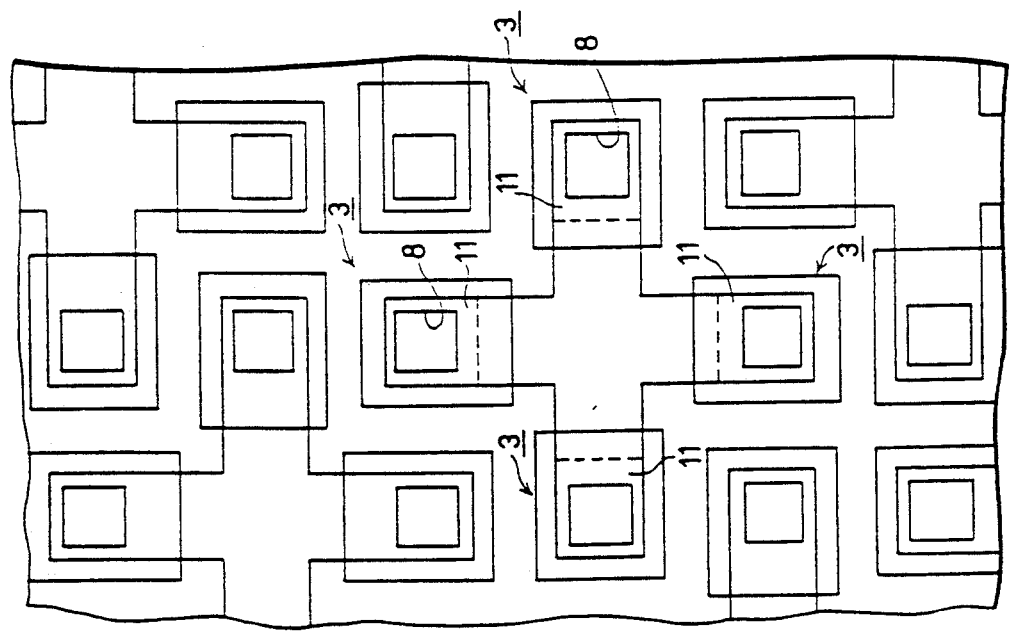

Referring to FIGS. 3 and 6, the capacitors 3 are disposed to connect with the n+impurity regions 11 located at the four ends of each cross-shaped active region 30. In FIGS. 3 and 4, the capacitors 3 have combined structures consisting of capacitors of a trench type and a stacked type. Trenches 8 are formed in the source/drain regions 11 in the transfer gate transistors. A first dielectric layer 9 is formed at the inside of each trench 8 except for the upper end thereof. A storage node 6 made from polycrystal silicon is formed on the surface of the first dielectric layer 9. Each storage node 6 has an end which is extended over the gate electrode 20b (word line) with an insulator layer 15 and a side insulator layer 16 therebetween. Further, a portion of the storage node 6 is connected to the n+impurity region 11 of the transfer gate transistor 4. A second dielectric layer 10 is formed on the surface of the storage node 6. A cell plate 18 made from polycrystal silicon is formed on the surface of the second dielectric layer 10. The upper surface 10 of the cell plate 18 is covered with a layer insulator 19.

Referring to FIG. 4 and others, in the first memory cell array block 50a, one of the bit line pair 24 has a two-layer structure including a first bit line 24b and a second bit line 24b, and the other bit line 25 has a single layer structure including a first bit line 25b. The second bit line 24a, the first bit line 24b and the first bit line 25b are arranged in lower, middle and upper layers, respectively.

Figure 7:
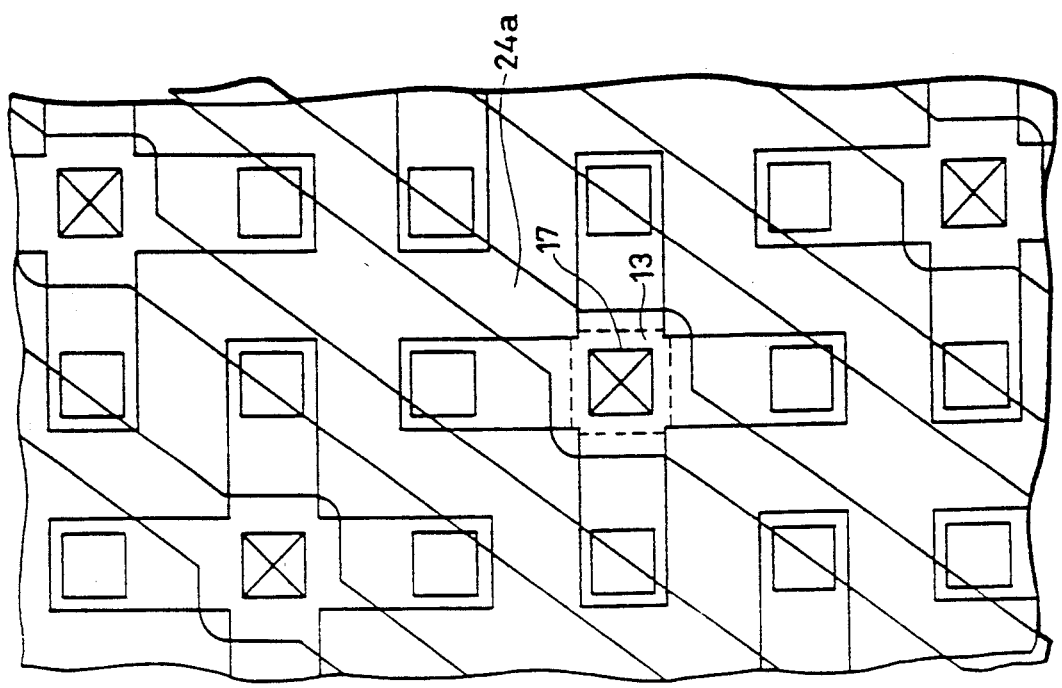

Referring to FIGS. 3 and 7, the second bit lines 24a of the bit lines 24 are formed to extend in an oblique direction with respect to the word lines 20a and 20b, and are connected through bit line contact portions 17 to the source/drain regions (n impurity regions 13), each of which is commonly used by the four transfer gate transistors.

Figure 8:
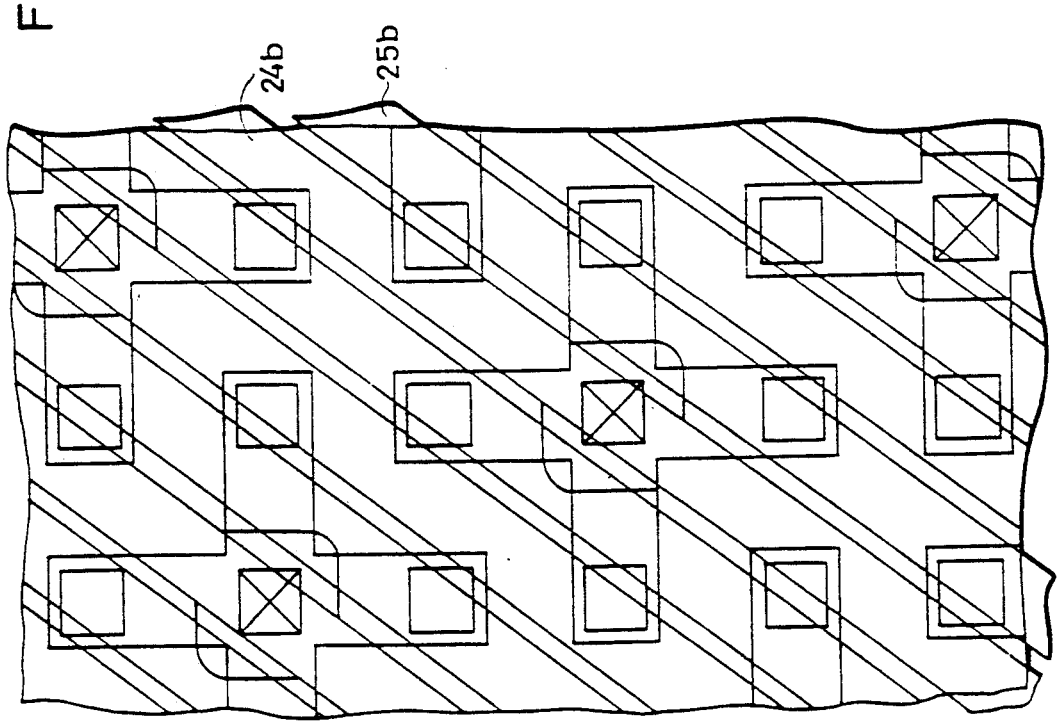

Referring to FIG. 8, the first bit lines 24b are formed above the second bit lines 24a with a layer insulator 21 therebetween, and extend parallel to them. Further, the first bit lines 25b are located in the layer above the first bit lines 24b, and are also located parallel to and between the first bit lines 24b.

Figure 9A:
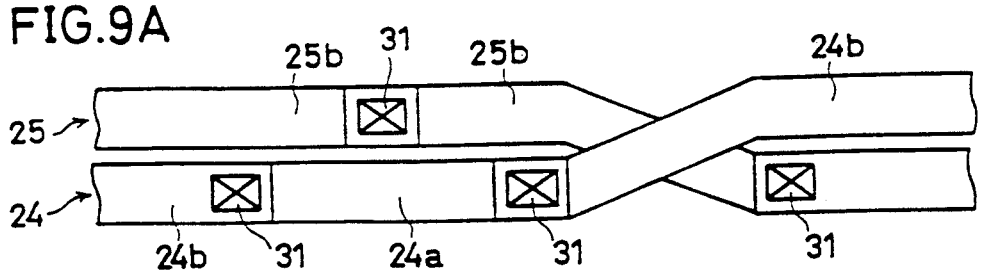
FIGS. 9A and 9B are plan and perspective views illustrating a intersection structure of bit lines between memory cell array blocks according to a first embodiment, respectively.
Figure 9B:
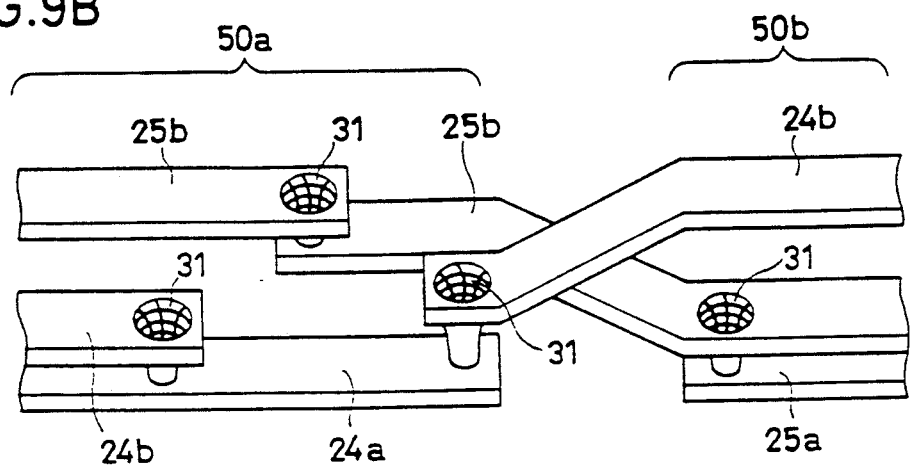

Referring to FIGS. 9A and 9B, one bit line 24 in each bit line pair has such a structure that the first bit line 24b and the second bit line 24a in the first memory cell array block 50a are connected together through a contact 31 at an end of the block 50a. This second bit line 24a has an end which extends beyond the first bit line 24b in the first memory cell array block 50a and is connected to the first bit line 24b extended from the second memory cell array block 50b through a contact 31. The other bit line 25 in each bit line pair is connected to the first bit line 25b extended from the second memory cell array block 50b through a contact 31 located at the end of first memory cell array block 50a. Further, the first bit line 25b in the second memory cell array block 50b is connected at its end to the second bit line 25a through a contact 31. Further, the first bit line 24b and the first bit line 25b located in the different layers are crossed each other in a boundary region between the first and second memory cell array blocks 50a and 50b.

Figure 10A:
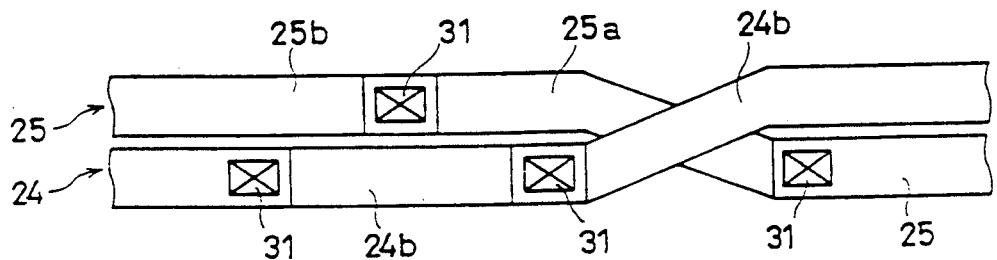
FIGS. 10A and 10B are plan and perspective views illustrating a modification of a structure in FIGS. 9A and 9B, respectively.
Figure 10B:
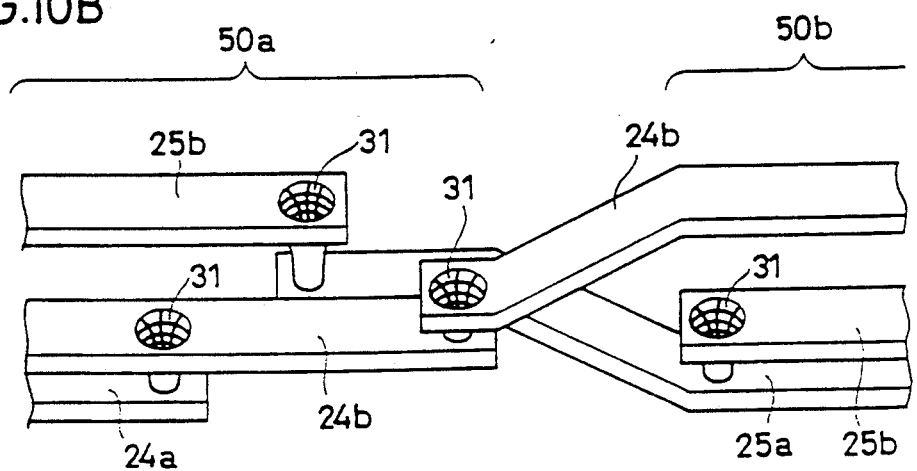

Referring to FIGS. 10A and 10B illustrating a modification, the bit line 24 in each bit line pair includes the first bit line 24b extended at the end of the first memory cell array block 50a to connect with the first bit line 24b extended from the second memory cell array block 50b through a contact 31. Further, the other bit line 25 has such a structure that the first bit line 25b in the first memory cell array block 50a is connected to the second bit line 25a extended from the second memory cell array block 50b through a contact 31 located at the end of the block 50a. The first bit line 24b and the second bit line 25a located at the different layers are crossed each other at the boundary region between the first and second memory cell array blocks 50a and 50b.

In the memory cell array of the DRAM according to the embodiment described above, one bit line contact is formed with respect to the memory cells for four bits, and thus the high integration of the memory cell array can be achieved. Further, the capacitors in the memory cells are formed of the stacked capacitors which are extended over the word lines 20a and 20b, and thus the capacity thereof can be increased without increasing the occupied plane area on the substrate. Owing to the manufacturing processes described below, the source-/drain regions 11 and 13 of the transfer gate transistors 4 are self-aligned to the gate electrodes (word lines 20a and 20b), and thus the uniformity of the channel lengths can be improved.

The manufacturing processes of the memory cells in the above stated embodiment will be described below, with reference to Figs. 11A-11J.

Referring to FIG. 11A, a silicon nitride film is formed to cover predetermined regions of the main surface of the p-type silicon substrate 7. Then, boron (B) is ion-injected into the surface of the p-type silicon substrate, using the above silicon nitride film as a mask, to form p-type impurity region for a channel stopper 23. Then, thermal oxidation is effected to form a field insulator film 22 consisting of a thick silicon oxide film. In this process, the field insulator film 22 is formed in a region other than the active regions 30 in the transfer gate transistors. The silicon nitride film is then removed, and the ion-injection of the boron is effected to form p-type impurity regions which form channel regions 12. Thermal oxidation is then effected on the main surface of the p-type silicon substrate 7 to form a thin silicon oxide film. A conductive polycrystal silicon layer is further formed on the surface, and a silicon oxide film is deposited on the surface by a CVD method. Thereafter, the silicon oxide film, polycrystal silicon layer and thin silicon oxide film are patterned to have predetermined configurations by the lithography and etching method. Thereby, the gate insulator films 14, word lines 20b and insulator layers 15 are completed.

Thereafter, subsequent processes start for forming the word lines 20a perpendicular to the word lines 20b. These processes employ a series of processes from the formation of the gate insulator films by the thermal oxidation to the patterning of the word lines having the predetermined configurations, which are effected in the same manners as those described above. Thereby, the word lines 20a crossing the word lines 20b are formed. Then, the silicon oxide film 16 is formed on the whole surface by the CVD method.

Then, referring to FIG. 11B, anisotropic etching is effected by a RIE (reactive ion etching) method to leave the silicon film 16 only on side walls of the word lines 20a and 20b. Thereby, the side insulator layers 16 are formed.

Figure 11C:
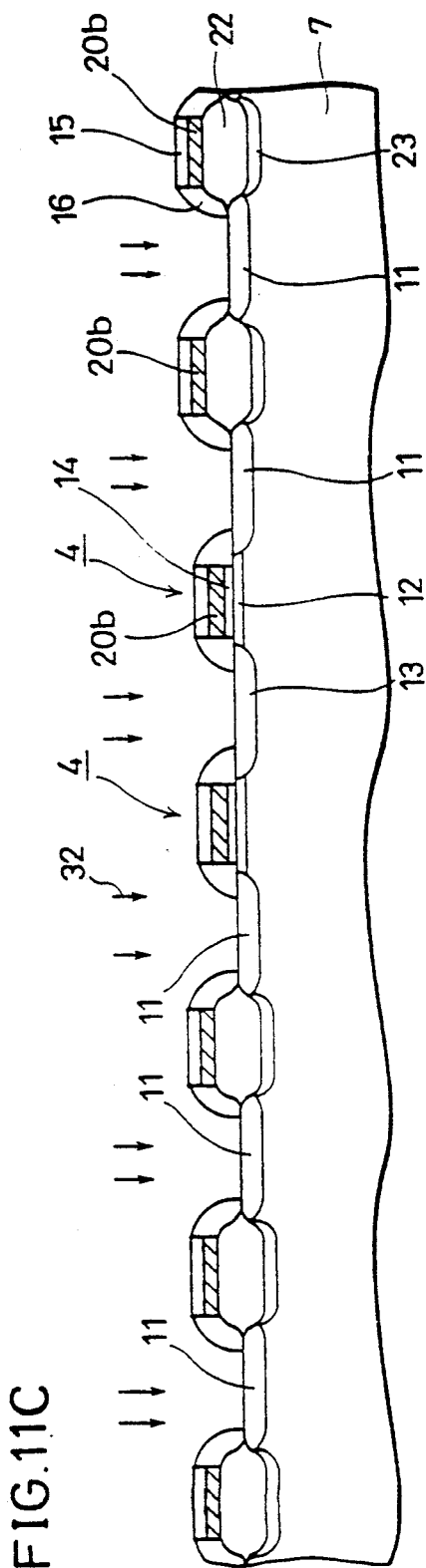

Referring to FIG. 11C, the word lines 20a and 20b covered with the insulator layers 15 and 16 are then used as a mask for injecting arsenic (As) ion 32 into the surface of the p-type silicon substrate 7, whereby the n impurity regions 11 and 13 for the source/drain regions in the transfer gate transistors are formed. Thereby, the transfer gate transistors 4 are completed.

Figure 11D:
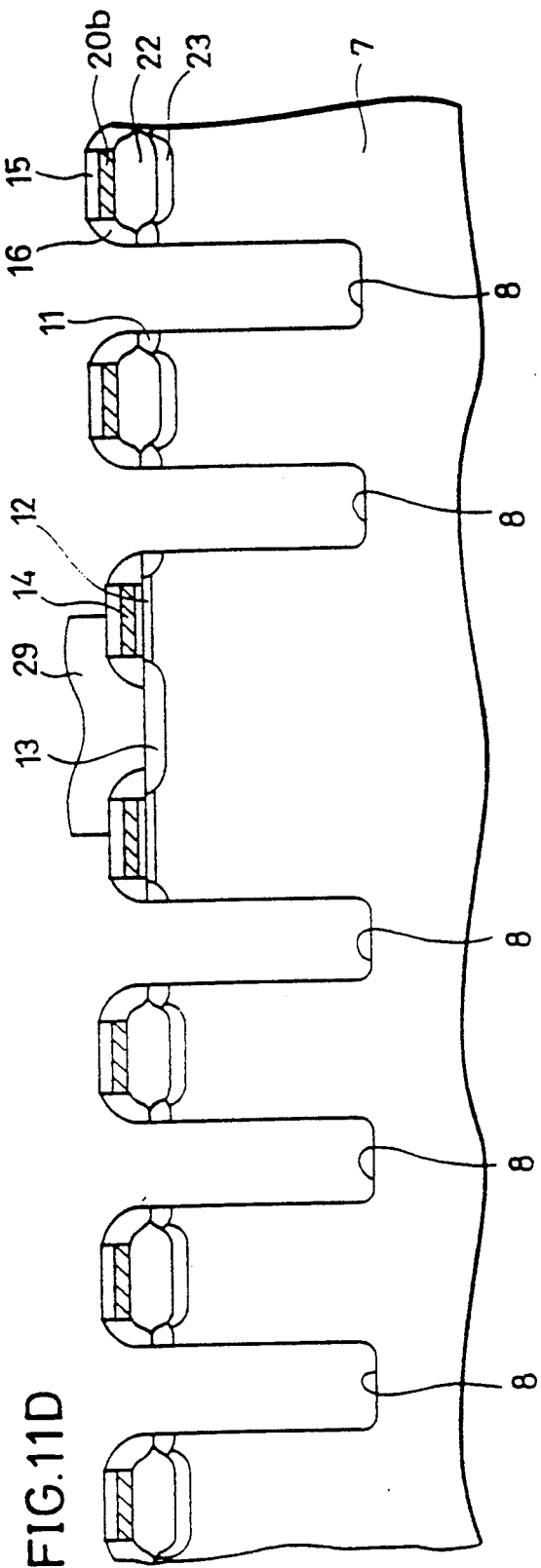

Referring to FIG. 11D, resist 29 is applied to mask the surface of each n+impurity region 13 commonly used by the four transfer gate transistors. Reactive ion etching is then effected on the exposed surface of the p-type silicon substrate 7 to form the trenches 8 in the silicon substrate 7. Thereafter, the resist 29 is removed.

Figure 11E:
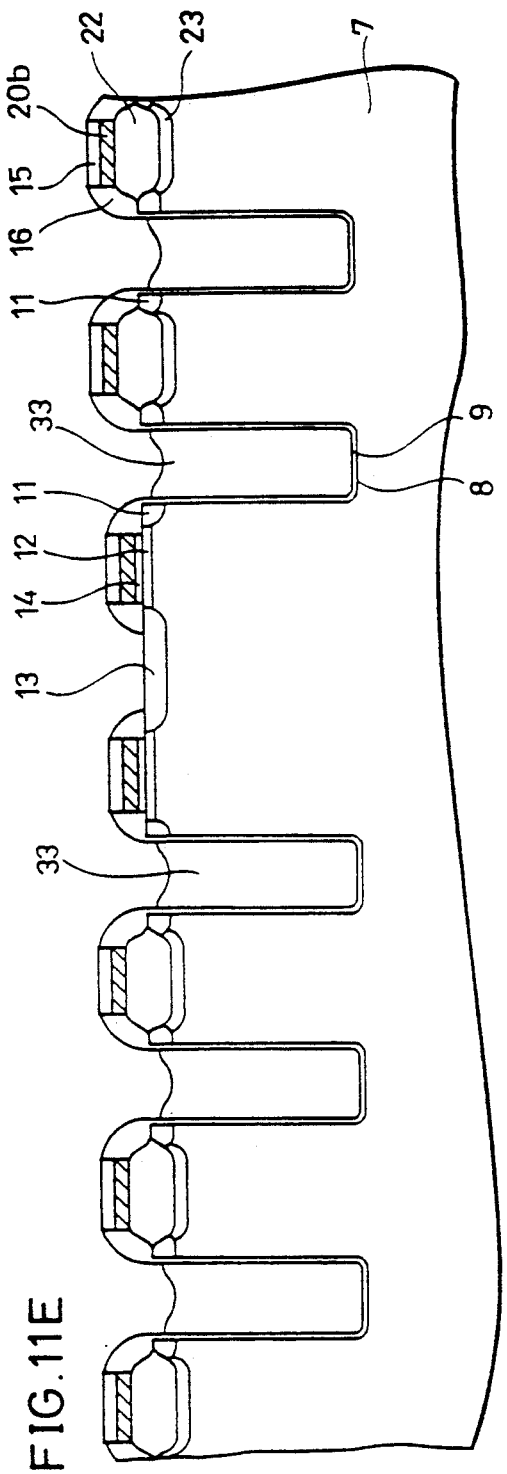

Then, referring to FIG. 11E, thermal oxidation is effected to form the first dielectric layer 9 having a relatively small thickness on the bottom and side walls of the trenches 8. After applying thick resist 33 on the whole surface, predetermined thickness thereof is removed by etching to leave the resist 33 only inside the trenches 8. The time for etching is controlled so as to locate each surface of the resist 33 at a nearly middle position, in a direction of diffusion depth, of the n+impurity regions 11. The resist may suitably be material having a low viscosity for promoting flatness.

Figure 11F:
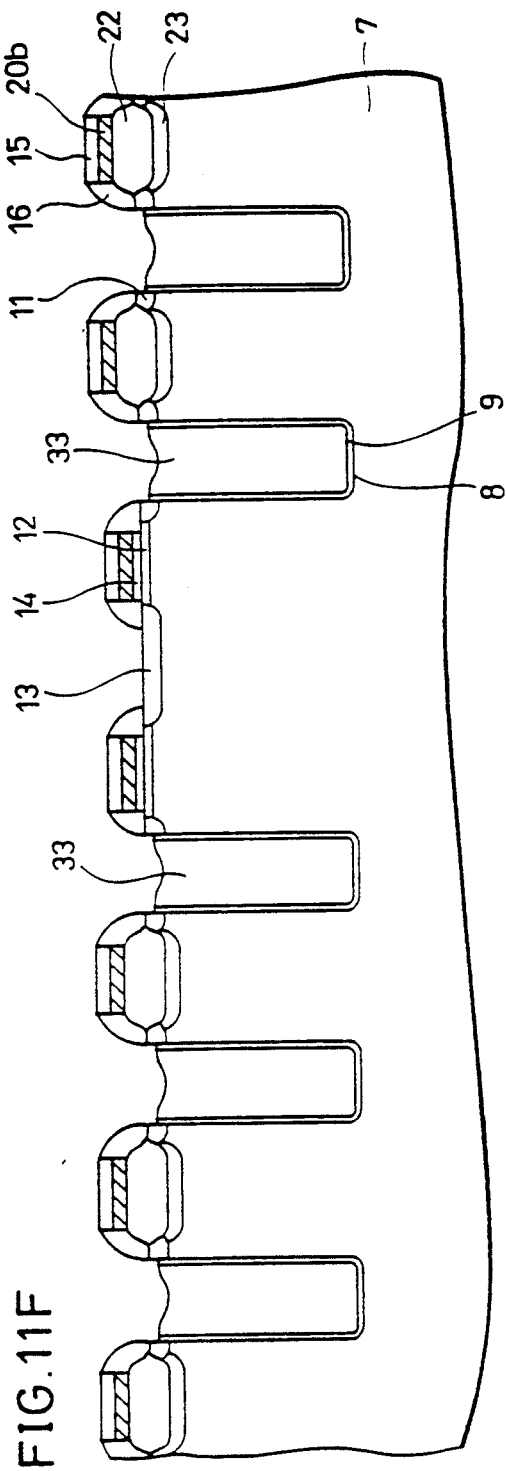

Referring to FIG. 11F, wet etching is effected to selectively remove portions of the first dielectric layer 9 which are not covered with the resist 33. Thereby, surfaces of the n+impurity regions 11 are exposed at the upper portions of the trenches 8. The resist 33 is removed thereafter.

Figure 11G:
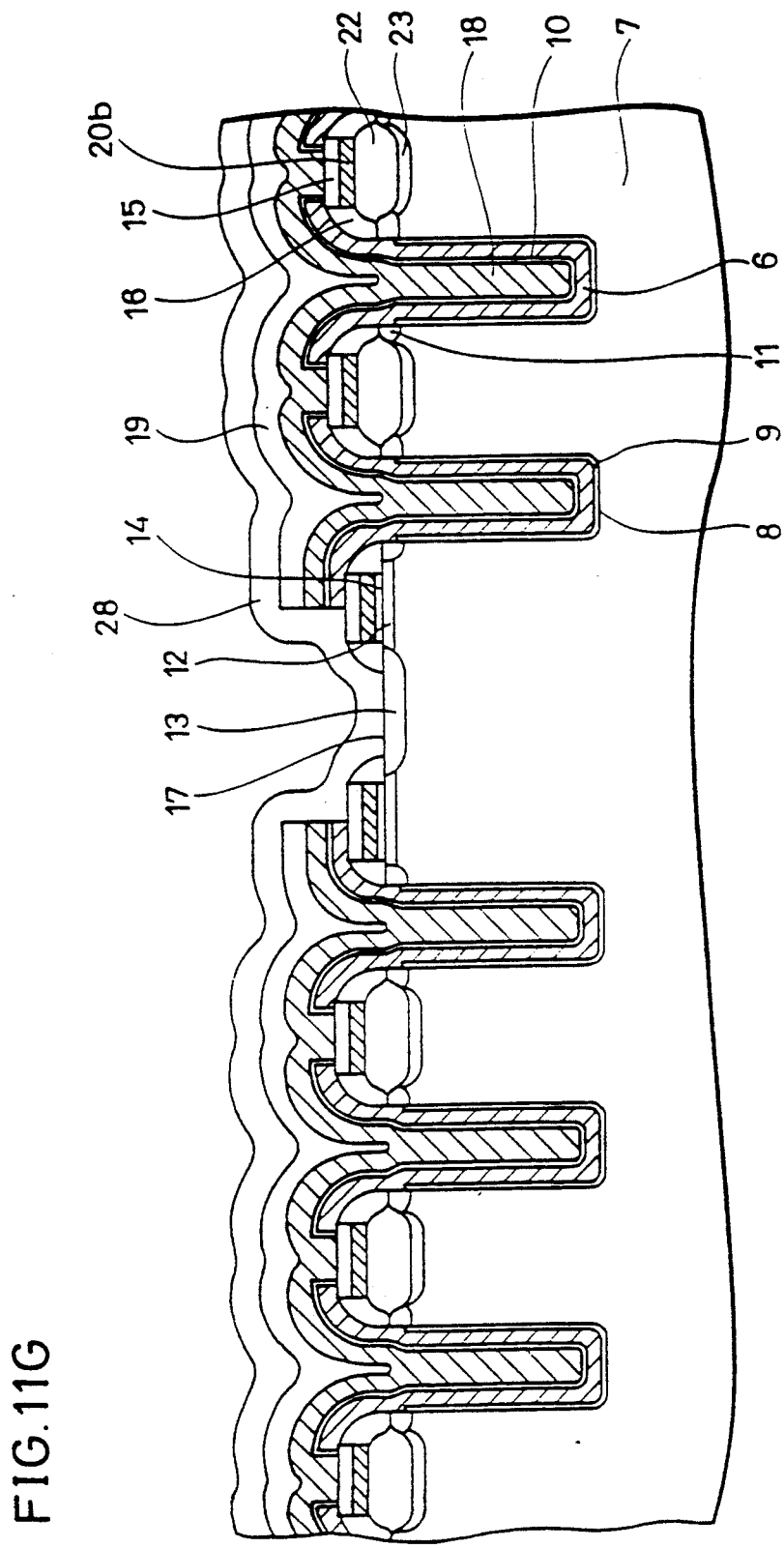
Figure 11H:
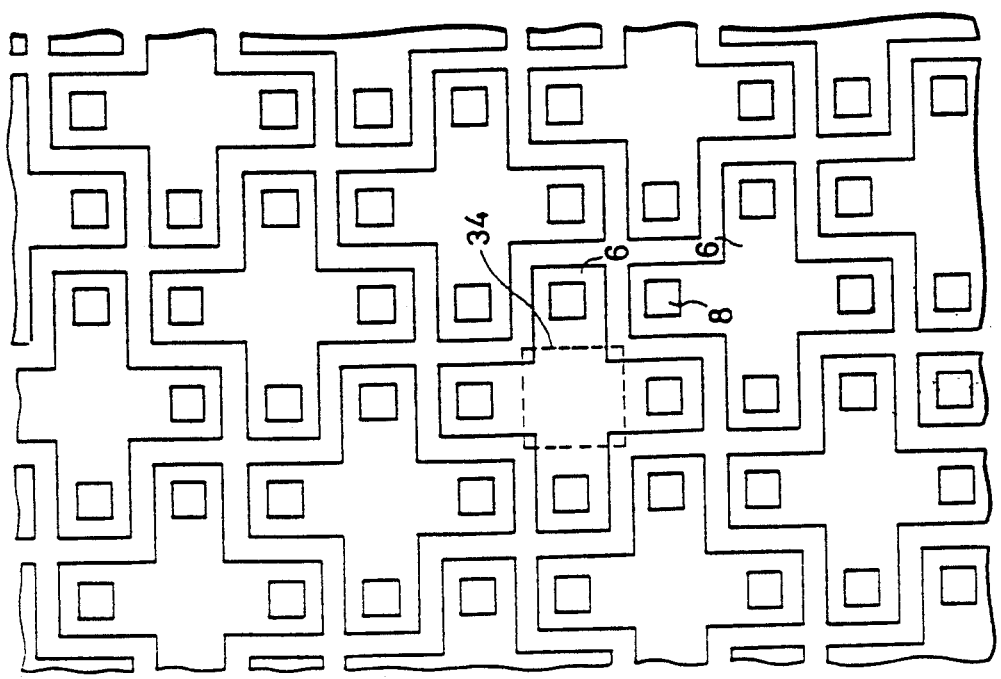
Figure 11I:
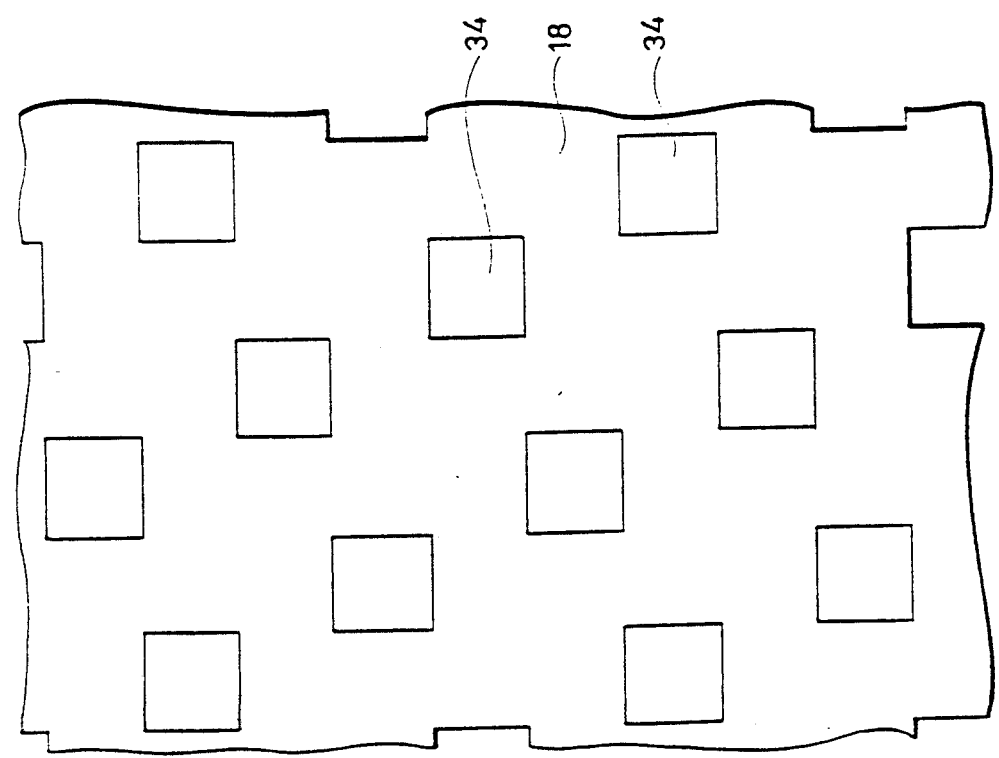

Referring to FIG. 11G, the conductive polycrystal silicon layer 9 is deposited on the surface of the silicon substrate 7 and inside the trenches 8, and patterned into a predetermined configuration. FIG. 11H illustrates the configuration of the polycrystal silicon layers 6 after the patterning. The polycrystal silicon layers 6 are patterned into the cross shapes, each of which integrally includes the four capacitors forming the memory cells for four bits. Then, the second dielectric layer 10 is formed on the surface of the polycrystal silicon layers 6, and the conductive polycrystal silicon layer 18 is formed on the surface thereof. The polycrystal silicon layer 18, the second dielectric film 10 and the polycrystal silicon layers 6 are patterned into predetermined configurations. FIG. 11I illustrates a top view of the configuration of the polycrystal silicon layer 18 after the patterning. This polycrystal silicon layer 18 forms a cell plate 18 of the capacitors. Openings 34 are formed in the cell plate 18 for the bit line contacts and similar openings are also formed in the second dielectric layer 10 and the polycrystal silicon layers 6. Each polycrystal layer 6 is divided into four portions by this opening 34 to form the storage nodes 6 for the four capacitors. In this process, the capacitors 3 in the memory cells are completed. Further, the silicon oxide film 28 is deposited on the whole surface of the capacitors 3 with the insulator 19 therebetween.

Figure 11J:
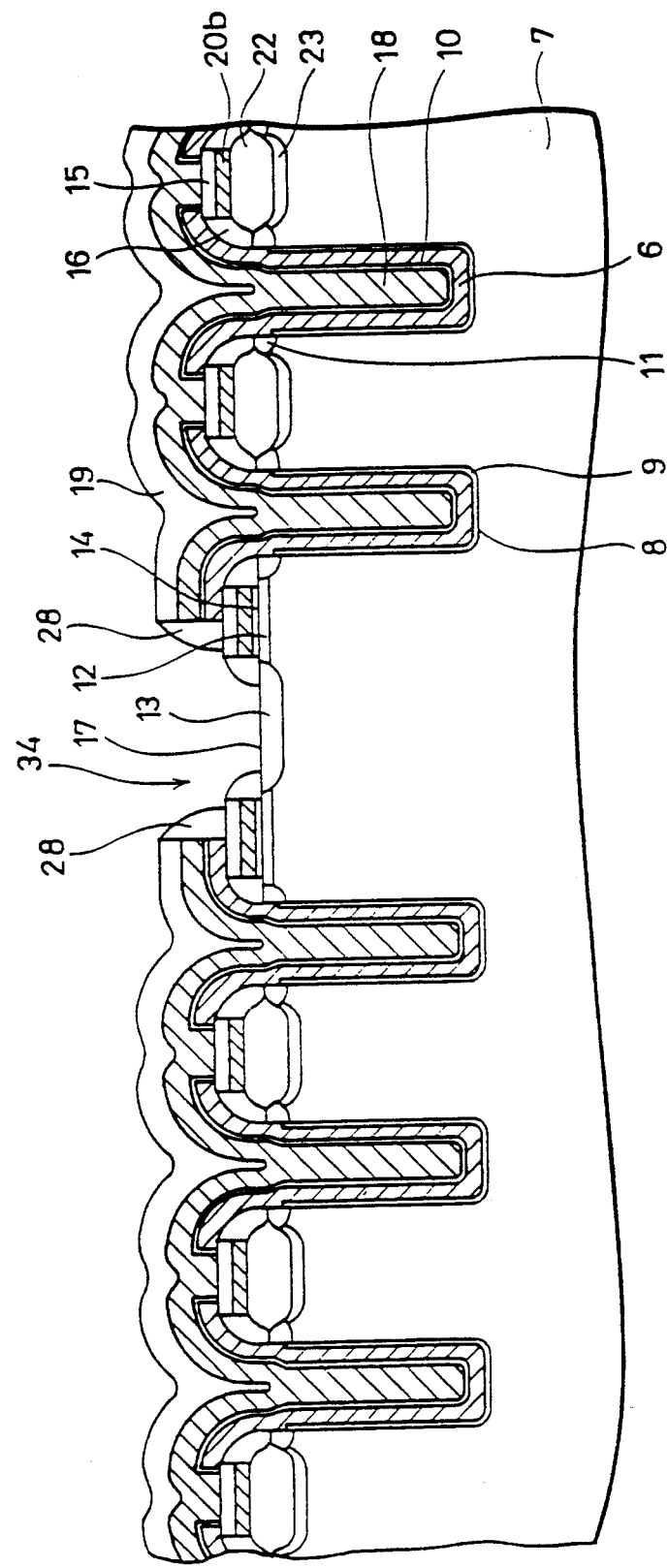

Referring to FIG. 11J, anisotropic etching such as reactive ion etching is effected on the silicon oxide film 28 to form side oxide films 28 on the sides of the openings 34 for the capacitors 3. This simultaneously exposes the surfaces of the n+impurity regions 13, each of which is commonly used by the four transfer gate transistors.

Then, a conductive polycrystal silicon layer is deposited on the whole surface, and a predetermined configuration, e.g., a pattern shown in FIG. 7, is formed. Thereby, the second bit lines 24a and 25a of the bit lines are formed. The layer insulator 21 made of a silicon oxide film, which includes boron and phosphorus (P) and has good flatness, is formed on the whole surface of the silicon substrate 7. Then, the first bit lines 24b of aluminum (A1) are formed in the pattern shown in FIG. 8, and the surfaces thereof are covered with the layer insulator 26 made of a silicon oxide film. Then, the first bit lines 25b of the aluminum are formed in the pattern shown in FIG. 8B on the surface of the layer insulator 26, and the surface protection layer 27 made of a silicon nitride film is deposited thereon, which completes the structures shown in FIG. 4.

In the manufacturing processes of the memory cells described above, many self-alignment techniques are utilized. First, the formation of the bit line contacts 17 between the second bit lines 24a and the n+impurity regions is effected by means of the self-alignment of the side insulator layers 16 and 18 formed on the sides of the word lines 20b and the sides of the openings 34 in the capacitors 3. Further, each pair of the source/drain regions 11 and 13 in the transfer gate transistor 4 are formed by means of the self-alignment with respect to the gate electrodes (word lines 20a and 20b) and the side insulator layer 16. Further, the trenches 8 forming the capacitors 3 are formed by means of the self-alignment with respect to the side insulator layers 16. Further, the connection between the n+impurity regions 11 in the transfer gate transistors and the storage nodes 6 in the capacitors 3 can be automatically achieved without a lithography process using a mask.

Figure 12:
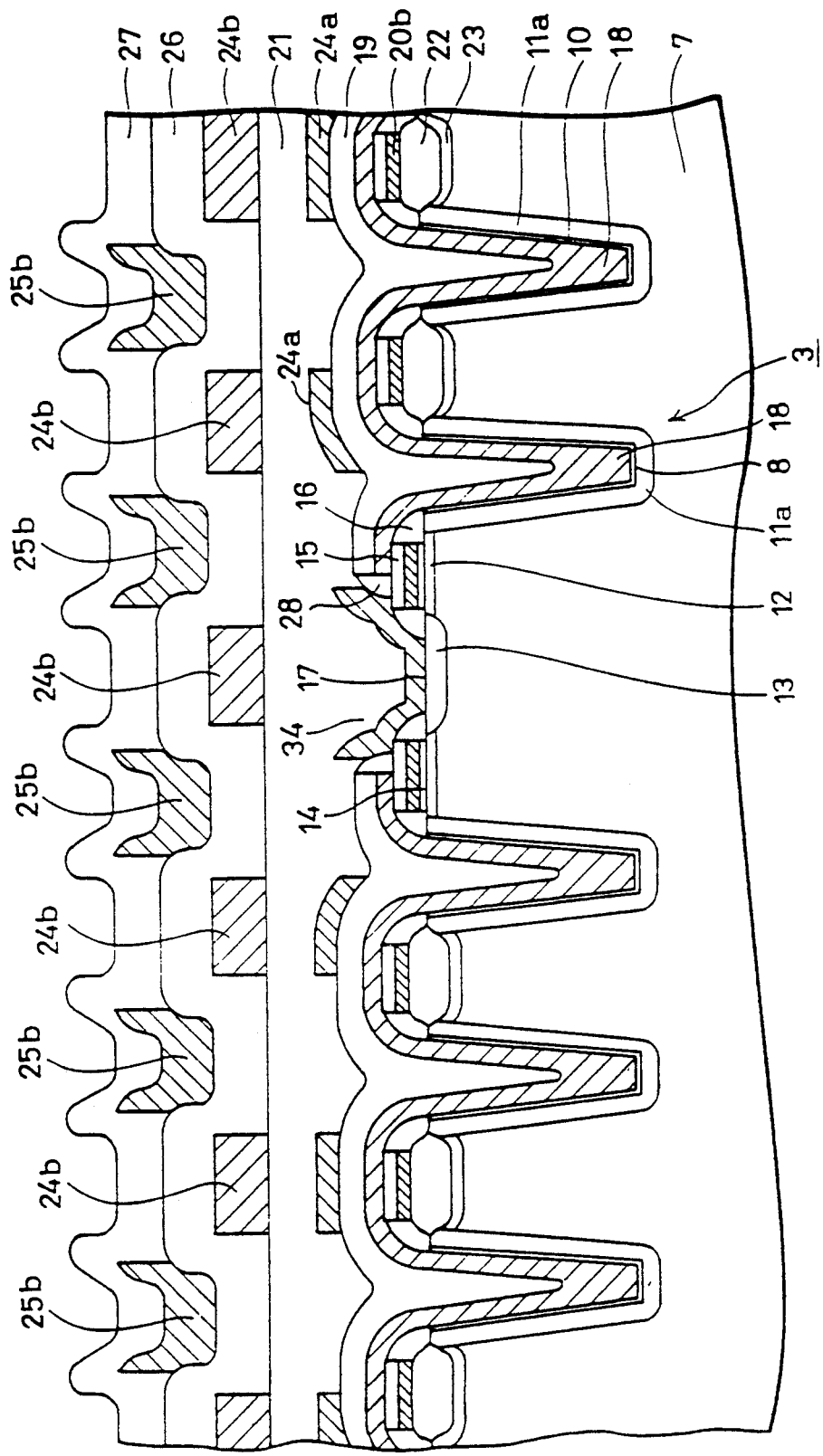
FIG. 12 is a section illustrating structures of memory cells in a DRAM according to a second embodiment of the invention.

Second embodiment of the invention will be described below. The second embodiment primarily differs from the first embodiment in the structures of the capacitors 3. Referring to FIG. 12, each capacitor 3 comprises the n+impurity region 11a formed on the surface of the trench 8 in the p-type silicon substrate 7, the dielectric layer 10 formed on the surface of the trench 8 and the cell plate 18 formed thereon. The surface of the cell plate 18 is covered with the layer insulator 19. In each opening 34 in the cell plate 18, ends of the layer insulator 19 and the cell plate 18 are covered with the side insulator layer 28. In the memory cell in this embodiment, the source/drain regions 11a in the transfer gate transistor 4 is commonly used by the storage node in the capacitor 3. The trench 8 is formed by means of the self-alignment with respect to the gate electrodes (word lines 20a and 20b), as will be described later. The n+impurity regions 13 are also formed by means of the self-alignment. Therefore, the channel lengths of the transfer gate transistors are determined by the self-alignment technique, and thus can be controlled more precisely.

Figure 13A:
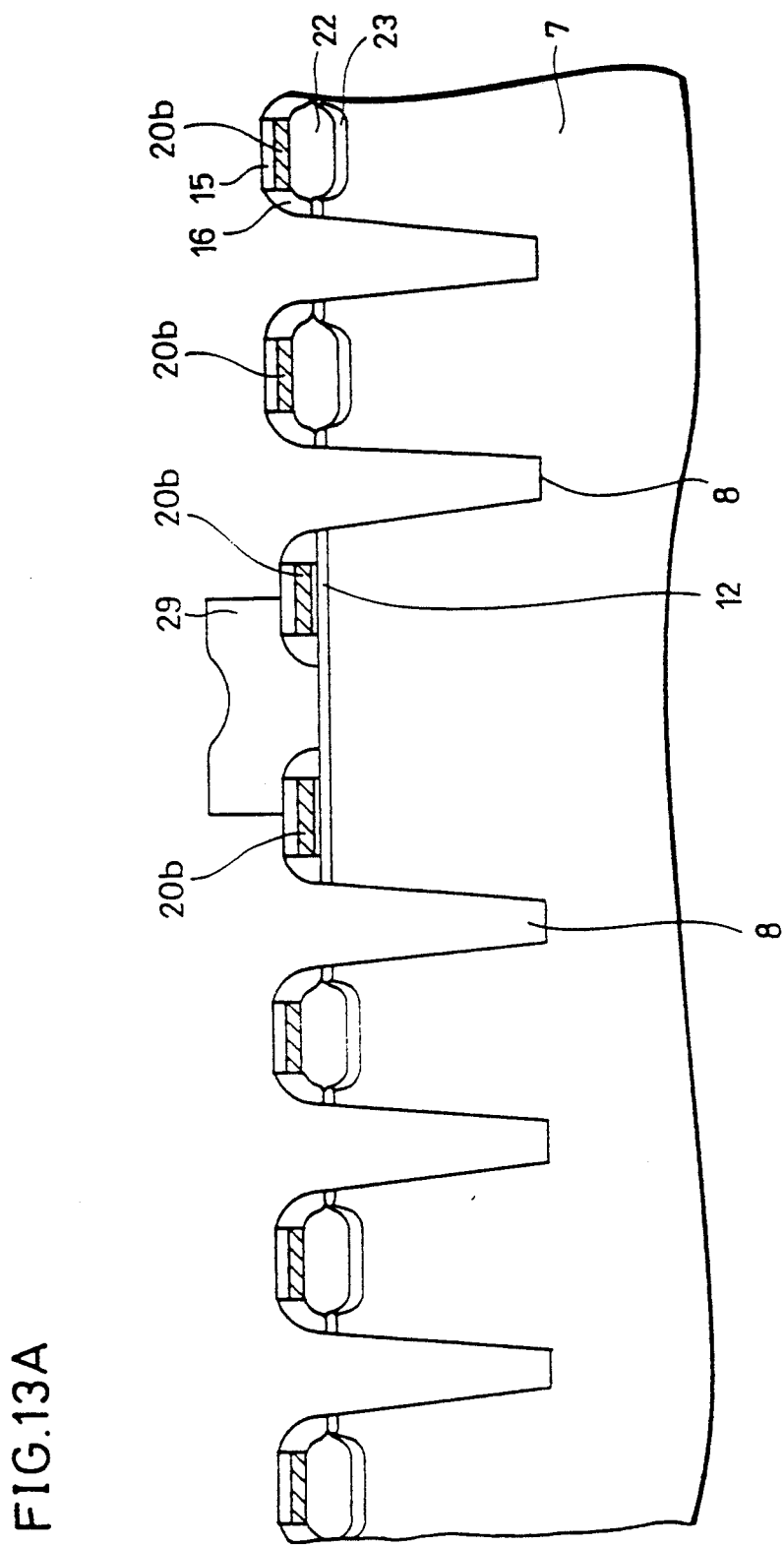
FIGS. 13A, 13B and 13C are sections illustrating manufacturing processes of memory cells shown in FIG. 12.

The manufacturing method of the memory cells in the second embodiment is described below. However, description of the manufacturing processes, which is same as those in the first embodiment and thus can be understood therefrom, will not be made hereinafter. The processes shown in Figs. 11A and 11B in the first embodiment are also applied in the second embodiment. Then, referring to FIG. 13A, the thick resist 29 is applied to cover the regions forming the n+impurity regions 13, each of which is commonly used by the four transfer gate transistors. Then, this resist 29 as well as the insulator layers 15 and 16 covering the word lines 20a and 20b are used as a mask, and the reactive ion etching is effected on the exposed surfaces of the p-type silicon substrate 7 to form the trenches 8.

Figure 13B:
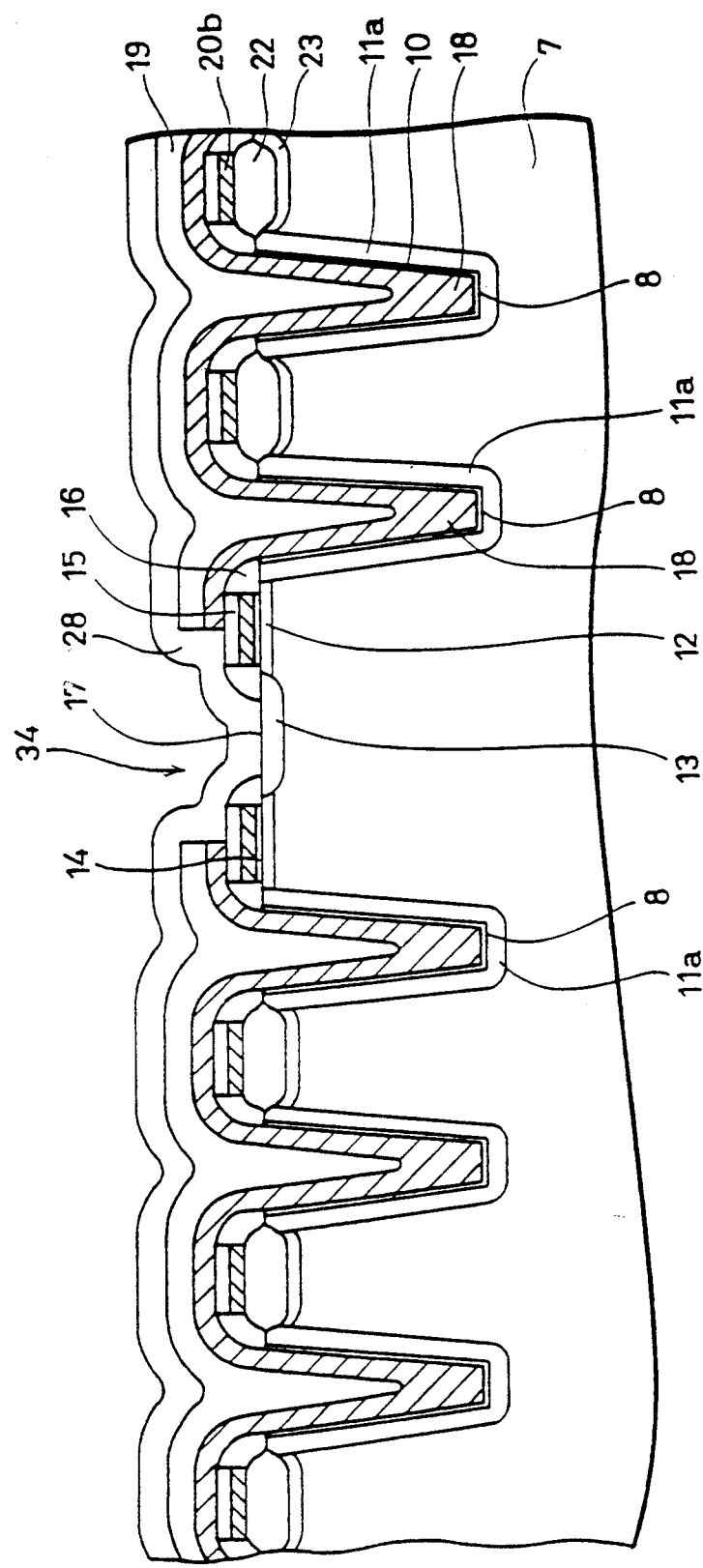

Referring to FIG. 13B, after removing the resist 29, an oblique rotary ion injection method is used to inject an arsenic ion into the surfaces of the p-type silicon substrate 7 and the trenches 8, and thus the n+impurity regions 11a and 13 for the source/drain regions are formed The n impurity regions 11a also form the storage nodes of the capacitors. In this process, the first source/drain regions 11a in the transfer gate transistors and the storage nodes in the capacitors are automatically connected to each other. Then, thermal oxidation is effected to form the second dielectric layer 10 consisting of a thin silicon oxide film on the bottom and side surfaces of each trench 8. The conductive polycrystal silicon layer and the silicon oxide film are deposited thereon, and are patterned into a predetermined configuration. Thereby, the cell plate 18 for the capacitors is formed. The openings 34 for the bit line contacts are formed in the cell plate 18. Then, the CVD method is used to deposit the silicon oxide film 28 on the whole surface.

Figure 13C:
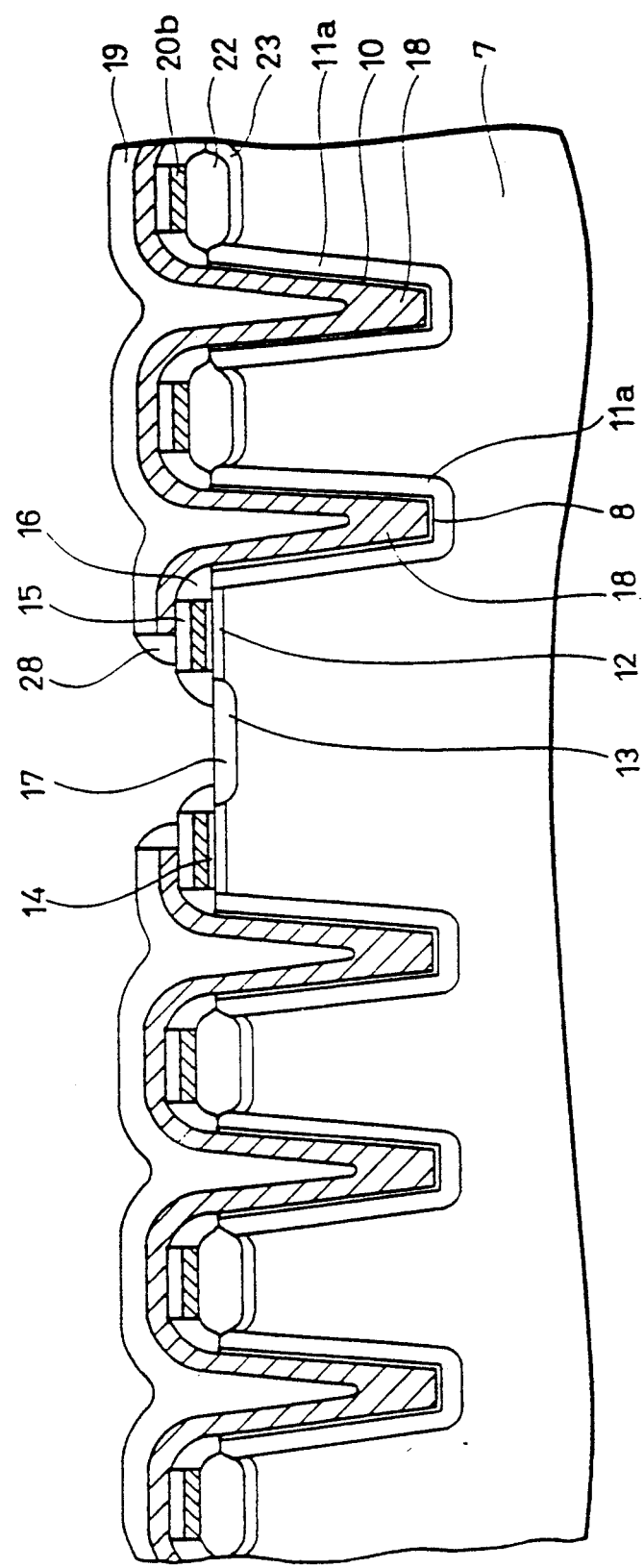

Referring to FIG. 13C, the anisotropic etching is effected on the silicon oxide film 28 by the reactive ion etching to form side insulator layers 28 on the sides of the openings 34 in the cell plate 18. In this process, the contact portions 17 for the bit line contacts are formed by means of the self-alignment.

The subsequent processes are same those in the first embodiment, and thus will not be described. After the above processes, the memory cells are completed.

Figure 14:
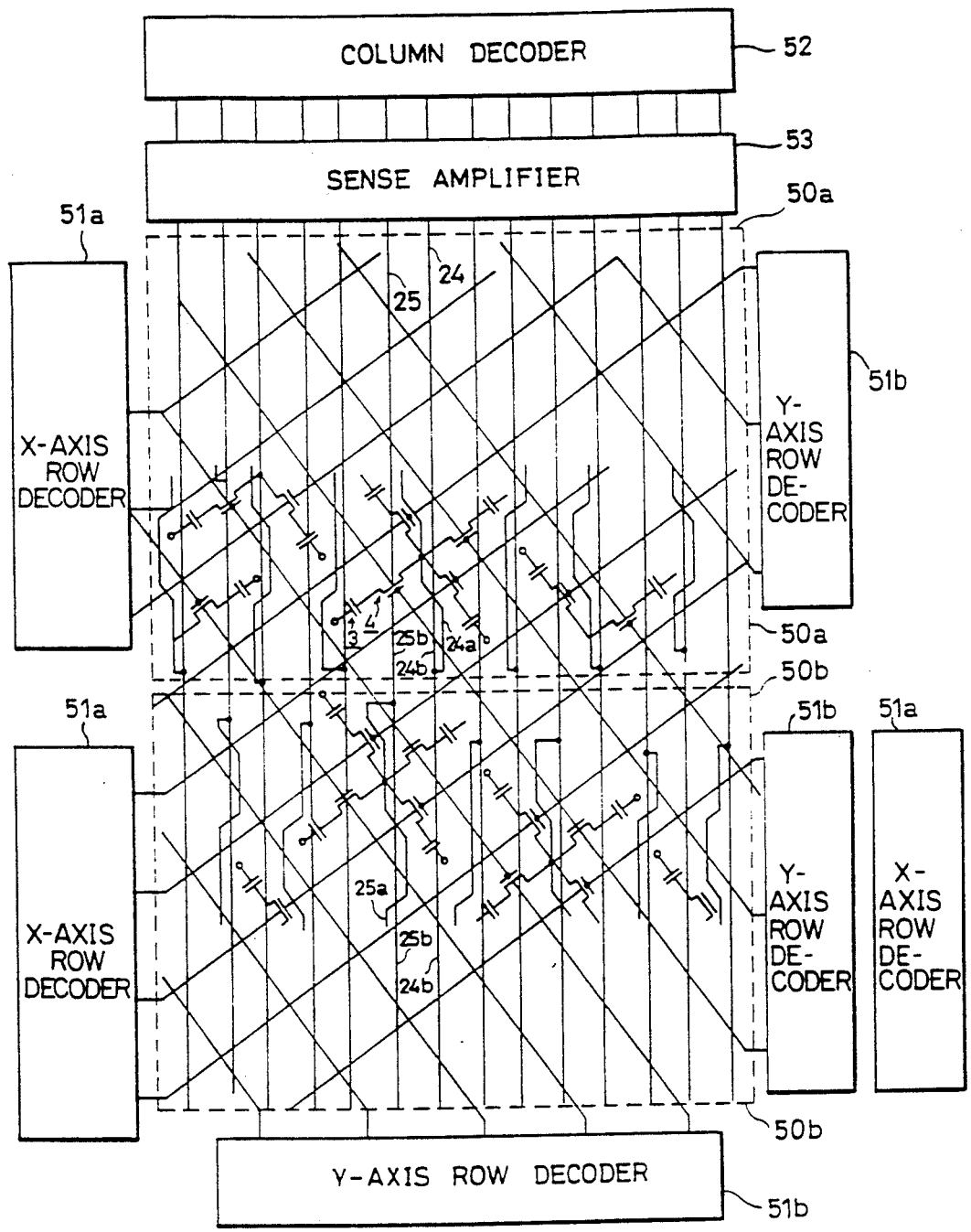
FIG. 14 is a block diagram of a memory cell array and others in a DRAM according to a third embodiment of the invention.
Figure 15:
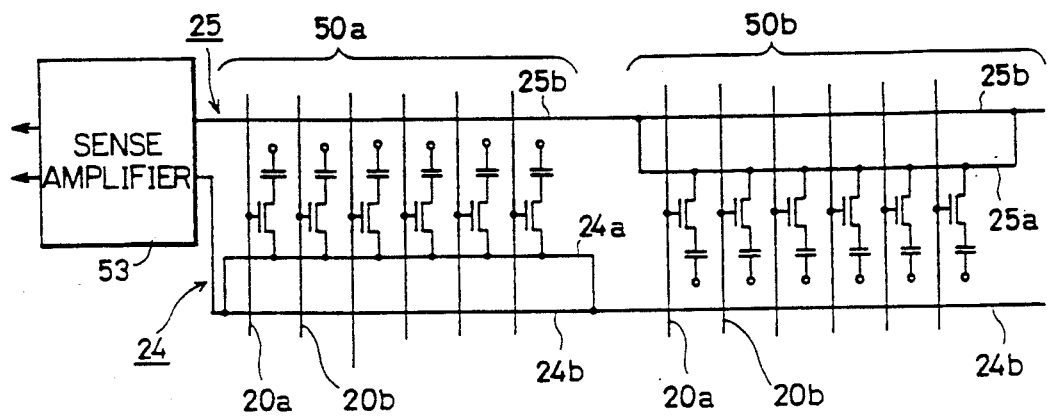
FIG. 15 is an equivalent circuit diagram of bit line pairs shown in FIG. 13.

The DRAM according to the third embodiment of the invention will be described with reference to FIGS. 14 and 15. The third embodiment differs from the first embodiment in that the bit lines in each pair extend parallel to each other through the first and second memory cell array blocks 50a and 50b without crossing each other at a region between the blocks 50a and 50a. That is; the bit line 24 of the bit line pair has a two-layer structure including the first bit line 24b and the second bit line 24a in the first memory cell array block 50a, and has a single layer structure including the first bit line 24b in the second memory cell array block 50b. This bit line 24 extends substantially straight between the two blocks. In the first memory cell array block 50a, the second bit line 24a connects with a plurality of memory cells. The other bit line 25 in each bit line pair contrarily has a single layer of the first bit line 25b in the first memory cell array block 50a and a two-layer structure including the first bit line 25b and the second bit line 25a in the second memory cell array block 50b. The second bit line 25a connects with a plurality of memory cells. Each bit line 25 extends substantially straight between the two blocks and is also parallel to the other bit line 24 of the bit line pair. The layout of the memory cells in the memory cell array is substantially same as that in the first embodiment, and thus will not be described.

Figure 16A:
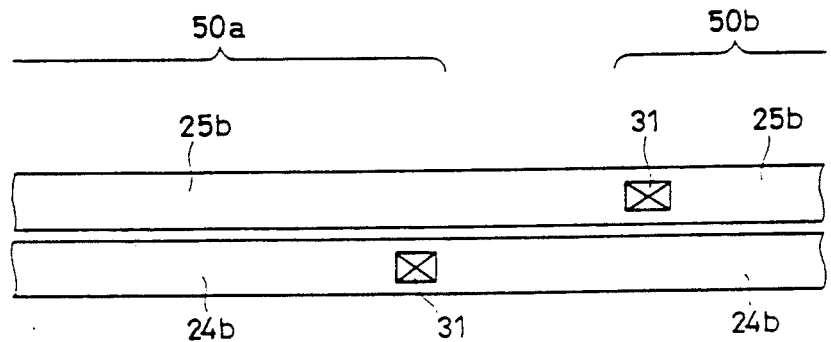
FIGS. 16A and 16B are plan and perspective views illustrating a intersection structure of bit lines between two memory cell array blocks.
Figure 16B:
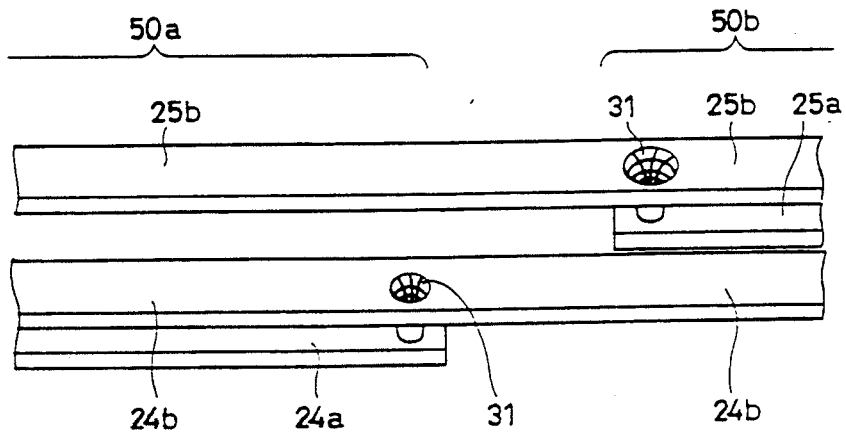
Figure 17:
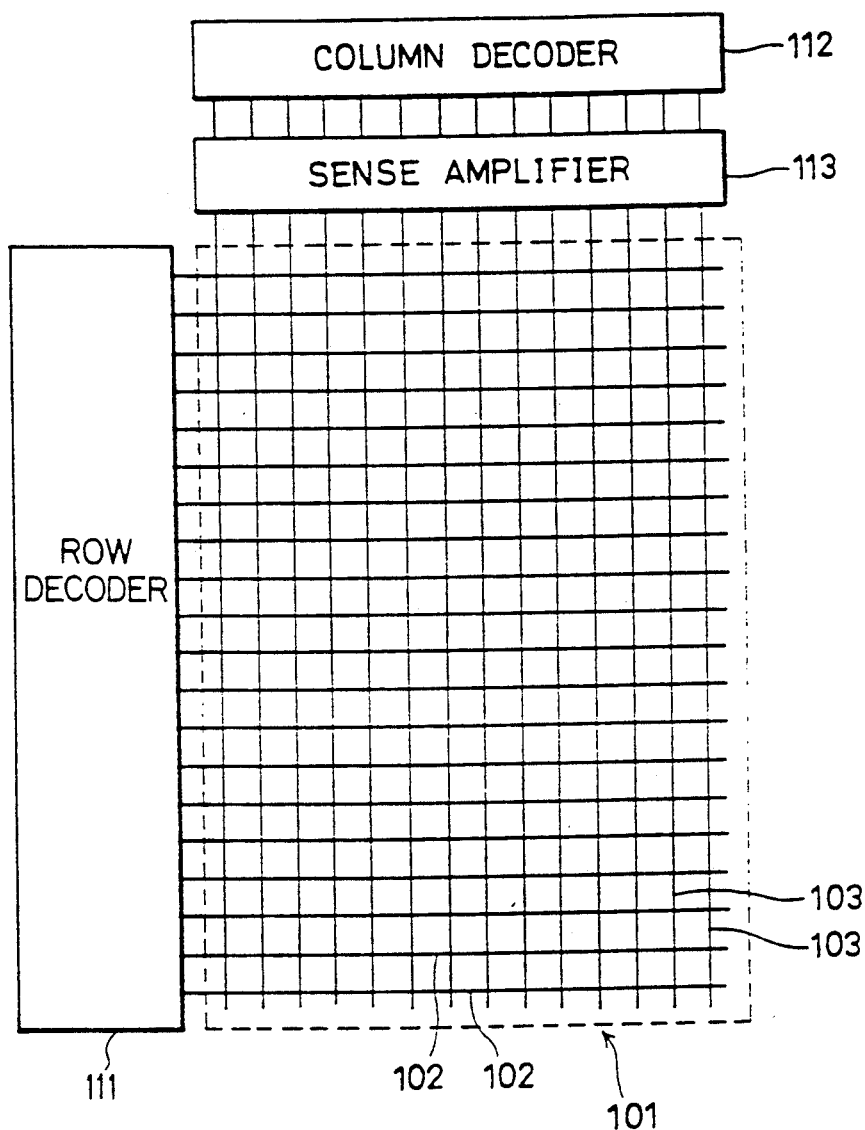
FIG. 17 is a block diagram of a memory cell array and others in a conventional DRAM.
Figure 18:
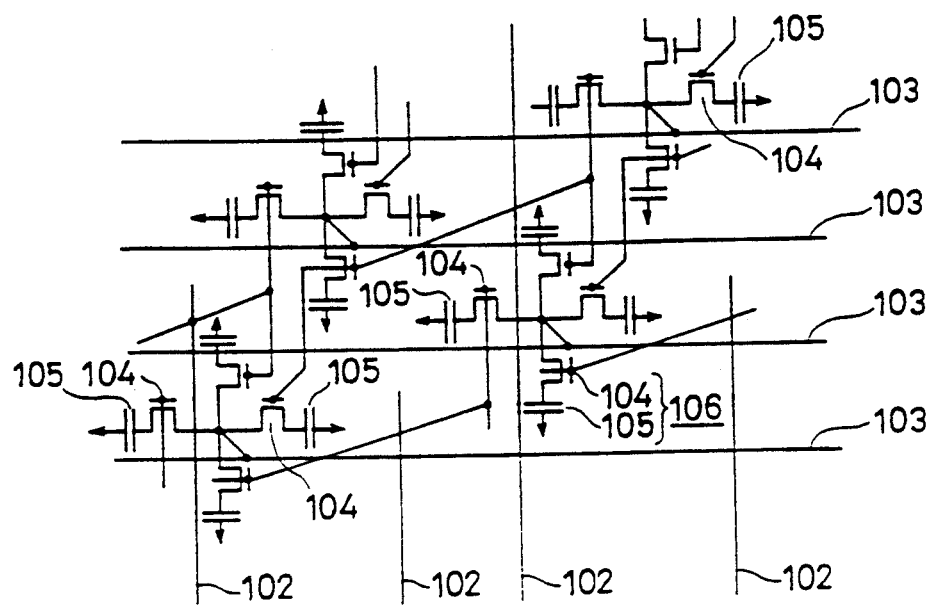
FIG. 18 is an equivalent circuit diagram of bit line pairs shown in FIG. 17.
Figure 19:
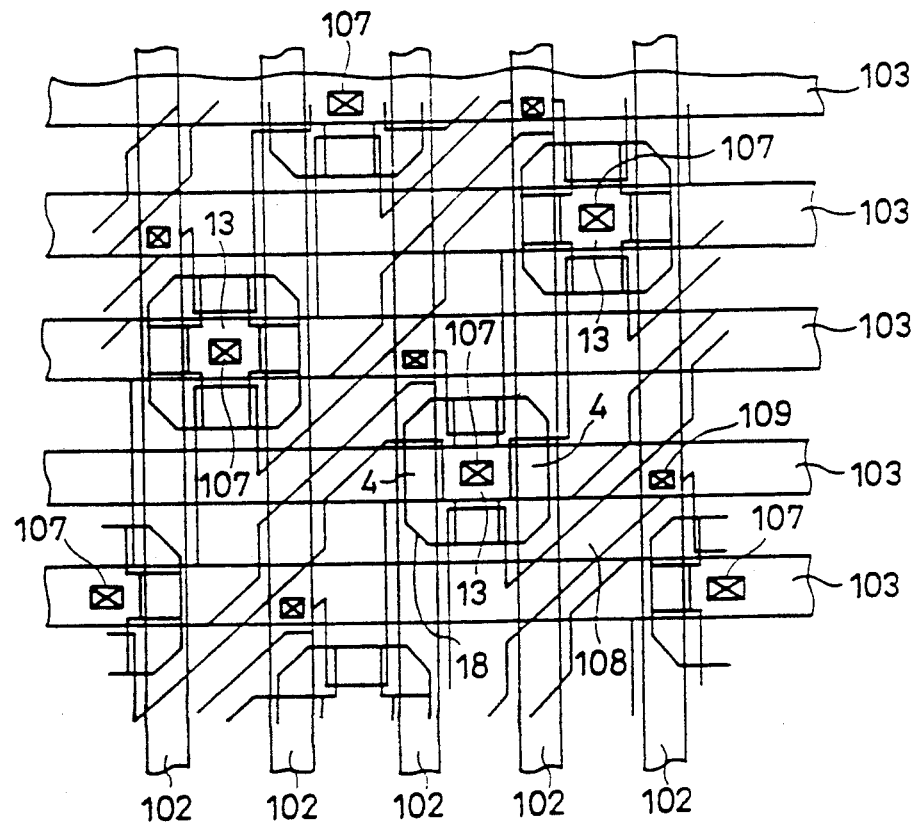
FIG. 19 is a plan illustrating structures of a conventional memory cell array.
Figure 20A:
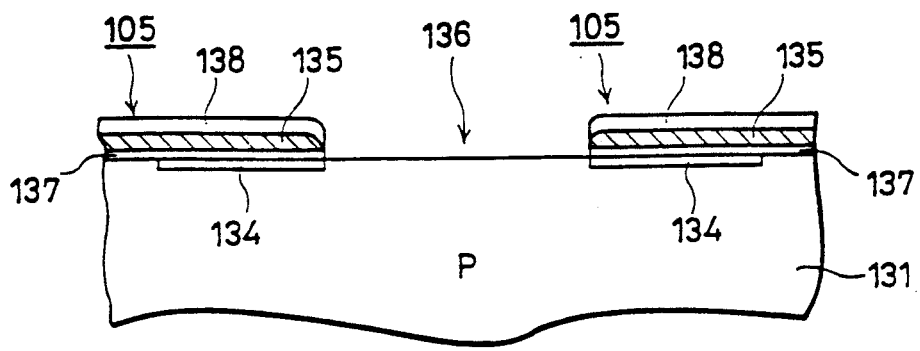
FIGS. 20A, 20B, 20C and 20D are cross sections of the conventional memory cells in various manufacturing steps.
Figure 20B:
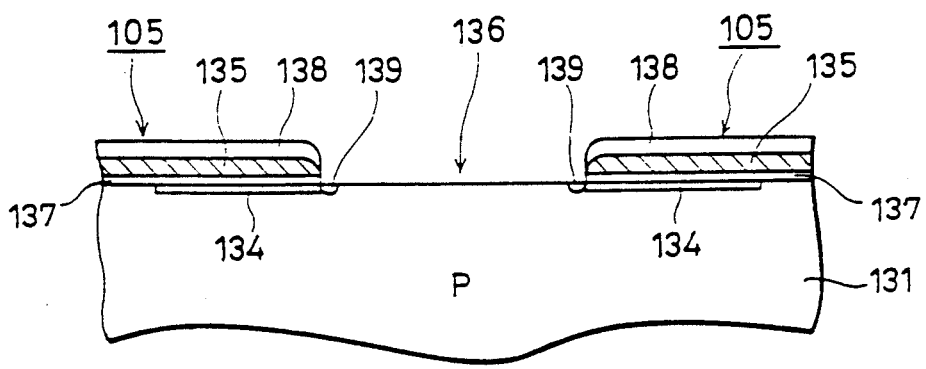
Figure 20C:
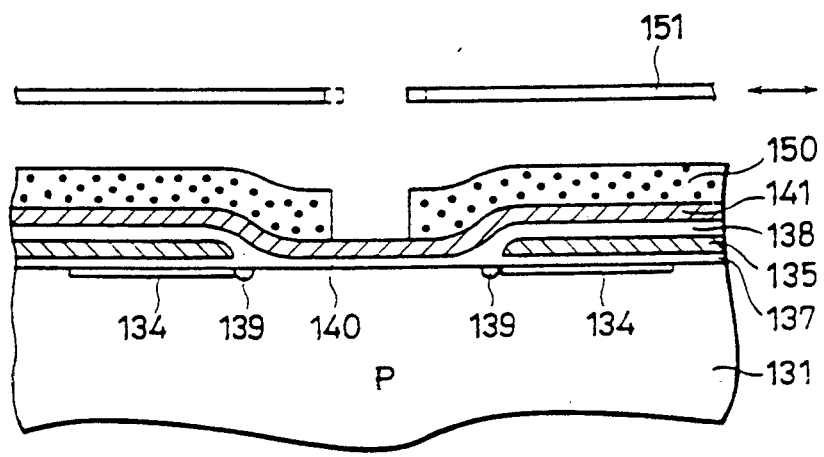
Figure 20D:
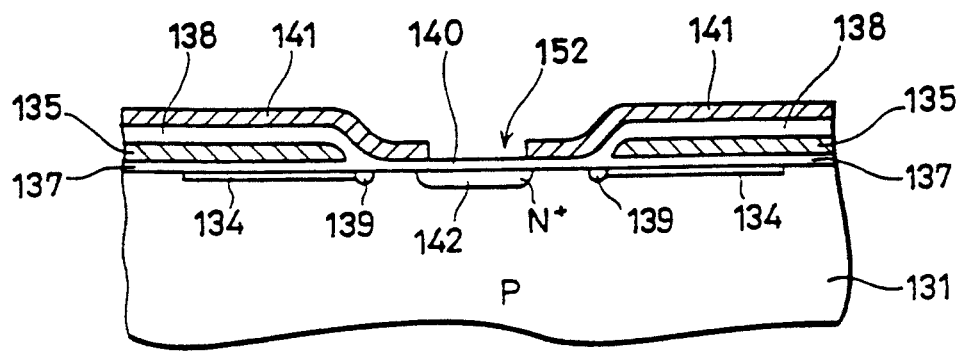
Figure 21:
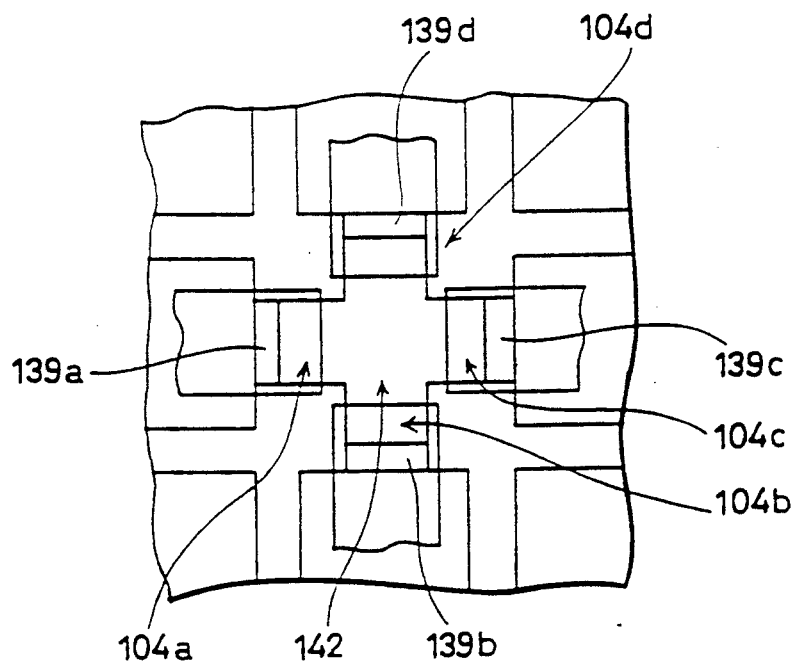
FIG. 21 is a plan illustrating structures of memory cells in FIG. 20D.

FIGS. 16A and 16B illustrate a connecting structure at a boundary region between the first and second memory cell array blocks 50a and 50b. In each block, the second bit lines 24a and 25a of the bit lines are disposed in lower layers, and the first bit lines 24b and 25b are located in upper layers. A plane layout of the bit lines in the memory cell array is same as that in the first embodiment shown in FIG. 8.

Naturally, the structures of the capacitors in the first and second embodiments described before may be applied to the capacitors in the third embodiment. Further, with respect to the capacitors, although the embodiments described above employ the combination of the capacitors of the stacked type and the trench type (first embodiment) as well as the capacitors of the trench type (second embodiment), the device may, of course, employ only the capacitors of the stacked type.

In the DRAM device according to the invention, as described hereinabove, the word lines which form the gate electrodes of the transfer gate transistors are disposed to cross each other in a grid-like relationship, and the respective source/drain regions are formed by means of the self-alignment with respect to the word lines. Further, each of the first source/drain regions is commonly used by the memory cells for the four bits, and is connected to the bit line through the one bit line contact. Therefore, controllability of the channel lengths of the transfer gate transistors can be improved and high integration can be achieved in the DRAM device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A DRAM device comprising a memory cell array which includes a plurality of memory cells for storing memory information in a minimum unit on a main surface of a semiconductor substrate of a first conductivity type; said device comprising:
said memory cells, each of which includes one transfer gate transistor (14) and one capacitor (3);
said transfer gate transistors, each of which includes a gate electrode (20a) including a part of a word line (20a) extending on a main surface of said semiconductor substrate (7) with an insulator layer (14) therebetween, and first and second impurity regions (11 and 13) of a second conductivity type which are formed in said semiconductor substrate with a predetermined space from each other and are self-aligned to said gate electrode;
said capacitors, each of which is connected to said second impurity region (11) in said transfer gate transistor, and has a portion extending over the gate electrode;
said transfer gate transistors arranged in such a manner that each said first impurity region is commonly used by the four transfer gate transistors which have said second impurity regions symmetrically and uniformly disposed around the first impurity region;
said word lines which are arranged perpendicularly to the adjacent word lines and are continuous to the transfer gate transistors, respectively; and
bit lines (24, 25) connected to said first impurity regions, each of which is commonly used by said four transfer gate transistors, and extending in an oblique direction with respect to said word lines.

2. A device according to claim 1, wherein said capacitors (3) have portions extended over insulator layers (15) formed on said word lines (20a).

3. A device according to claim 1, wherein trenches (8) are formed in regions of said second impurity regions (11), and said capacitors have portions including a first electrode layer (6) formed inside said trenches, a dielectric layer (10) formed on a surface of said first electrode layer and a second electrode layer (18) formed on a surface of said dielectric layer.

4. A device according to claim 3, wherein said first electrode layer of said capacitor includes a polycrystal silicon layer formed on an inner surface of said trench.

5. A DRAM device comprising a memory cell array which includes a plurality of memory cells for storing memory information in a minimum unit on a main surface of a semiconductor substrate of a first conductivity type; said device comprising:
said memory cells, each of which includes one transfer gate transistor (4) and one capacitor (3);
said transfer gate transistors, each of which includes a gate electrode (20a) including a part of a word line (20a) and extending on a main surface of said semiconductor substrate (7) with an insulator layer (14) therebetween, and first and second impurity regions (13 and 11) of a second conductivity type which are formed in said semiconductor substrate with a predetermined space from each other and are self-aligned to said gate electrode;
said capacitors, each of which is connected to said second impurity region (11) in said transfer gate transistor, and has a portion extending over the gate electrode;
said memory cell array (50) including a first region (50a) and a second region (50b) divided from each other;
amplifier means (53) arranged adjacent to said memory cell array;
a pair of bit lines (24 and 25) connected to said amplifier means and extending in the same direction from said amplifier means into said memory cell array;
one (24) of said pair of bit lines including a first conductive layer (24b) which extends through said first region (50a) and said second region (50b) in said memory cell array, and a second conductive layer (24a) which is formed in said first region, has an end connected to said first conductive layer and is connected to said first impurity regions of said transfer gate transistors in said memory cells arranged in said first region; and the other (25) of said pair of bit lines including a third conductive layer (25b) which extends through said first region (50a) and said second region (50b) in said memory cell array, and a fourth conductive layer (25a) which is formed in said second region, has an end connected to said third conductive layer and is connected to said first impurity regions of said transfer gate transistors in said memory cells arranged in said second region.

6. A device according to claim 5, wherein a pair of said bit lines (24 and 25) extend parallel to each other, and said first conductive layer (24b) of said one bit line (24) and said third conductive layer (25b) of said other bit line (25) are crossed each other at a boundary region between said first region (50a) and said second region (50b) in said memory cell array.

7. A device according to claim 5, wherein said memory cell array (1) has a rectangular planar region, said word lines extend in a direction obliquely crossing said bit lines, and said word lines are connected to memory cell selector means (51a and 51b) arranged along a side of said memory cell array other than a side adjacent to said amplifier means.

* * * * *